United States Patent
Yamamoto et al.

(10) Patent No.: US 8,941,099 B2
(45) Date of Patent: Jan. 27, 2015

(54) ORGANIC LIGHT EMITTING DEVICE AND MATERIALS FOR USE IN SAME

(75) Inventors: Hitoshi Yamamoto, Pennington, NJ (US); Michael S. Weaver, Princeton, NJ (US); Julia J. Brown, Yardley, PA (US); Kazuki Nishimura, Chiba (JP); Toshihiro Iwakuma, Chiba (JP); Chishio Hosokawa, Chiba (JP); Toshinari Ogiwara, Chiba (JP)

(73) Assignees: Universal Display Corporation, Ewing, NJ (US); Idemitsu Kosan Co., Ltd., Tokyo (JP)

(*) Notice: Subject to any disclaimer, the term of this patent is extended or adjusted under 35 U.S.C. 154(b) by 151 days.

(21) Appl. No.: 13/642,693

(22) PCT Filed: Jul. 7, 2010

(86) PCT No.: PCT/US2010/041177
§ 371 (c)(1),
(2), (4) Date: Feb. 4, 2013

(87) PCT Pub. No.: WO2012/005724
PCT Pub. Date: Jan. 12, 2012

(65) Prior Publication Data
US 2013/0126832 A1    May 23, 2013

(51) Int. Cl.
*H01L 35/24* (2006.01)
(52) U.S. Cl.
USPC .................................. 257/40; 257/E51.001
(58) Field of Classification Search
USPC .............................................. 257/40, E51.001
See application file for complete search history.

(56) References Cited

U.S. PATENT DOCUMENTS

| | | | |
|---|---|---|---|
| 6,830,828 | B2 | 12/2004 | Thompson et al. |
| 6,835,469 | B2 | 12/2004 | Kwong et al. |
| 6,902,830 | B2 | 6/2005 | Thompson et al. |
| 6,911,271 | B1 | 6/2005 | Lamansky et al. |
| 6,939,624 | B2 | 9/2005 | Lamansky et al. |
| 7,001,536 | B2 | 2/2006 | Thompson et al. |
| 2002/0182441 | A1 | 12/2002 | Lamansky et al. |
| 2006/0202194 | A1 | 9/2006 | Jeong et al. |
| 2006/0204785 | A1 | 9/2006 | Kim et al. |

FOREIGN PATENT DOCUMENTS

| | | |
|---|---|---|
| JP | 2003142267 A | 5/2003 |
| JP | 2004042485 A | 2/2004 |
| JP | 2004043349 A | 2/2004 |
| JP | 2004075567 A | 3/2004 |
| JP | 2005008588 A | 1/2005 |
| JP | 2005019219 A | 1/2005 |
| JP | 20061561966 A | 6/2006 |
| JP | 2007314506 A | 12/2007 |
| WO | 2007046658 A1 | 4/2008 |

OTHER PUBLICATIONS

Adachi, et al, "High-efficiency organic electrophosphorescent devices with tris(2-phenylpyridine)iridium doped into electron-transporting materials", Appl. Phys. Lett., 2000, 77, 904.

Lamansky, et al, "Synthesis and Characterization of Phosphorescent Cyclometalated Iridium Complexes", Inorganic Chemistry, 2001, 40, 1704.

Lamansky, et al, "Highly Phosphorescent Bis-Cyclometalated Iridium Complexes: Synthesis, Photophysical Characterization, and Use in Organic Light Emitting Diodes", J. Am Chem. Soc., 2001, 123, 4303.

*Primary Examiner* — Anthony Ho
(74) *Attorney, Agent, or Firm* — Duane Morris LLP

(57) ABSTRACT

The present invention provides an OLED in which an organic thin film layer comprising a single layer or plural layers between a cathode and an anode, wherein the organic thin film layer comprises at least one organic light emitting layer, wherein at least one light emitting layer comprises at least one host material and at least one phosphorescent emitter material, wherein the host material comprises a substituted or unsubstituted hydrocarbon compound having the chemical structure represented by the formula (A-I): formula (A-1) wherein $R^1$ and $R^2$ each represent independently a substituted or unsubstituted alkyl group having from 1 to about 5 carbon atoms; $Ar^1$ represents a divalent residue of a benzene ring, a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or picene ring; and $Ar^2$ represents a monovalent residue of a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or a picene ring; and $Ar^1$ and $Ar^2$ each may have independently one or plural substituent(s) selected from the group consisting of an alkyl group having 1 to about 3 carbon atoms, a cycloalkyl group having about 5 to about 7 ring-forming carbon atoms, a silyl group having about 3 to about 12 carbon atoms, a cyano group, a halogen atom and an aryl group having about 6 to about 16 ring-forming carbon atoms; and the phosphorescent emitter material comprises a phosphorescent organometallic complex having a substituted chemical structure represented by one of the following partial chemical structures represented by the formulae: formulae (I), (II), (III) wherein R is independently hydrogen or an alkyl substituent having 1-3 carbon atoms, and wherein at least one ring of the formula has one or more of said alkyl substituent.

(A-1)

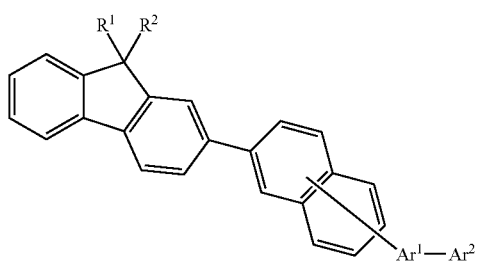

-continued (I)

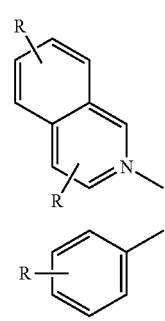

(II)

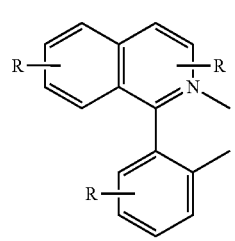

(III)

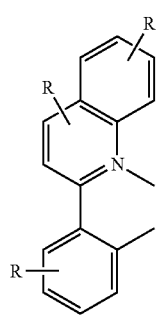

14 Claims, 1 Drawing Sheet

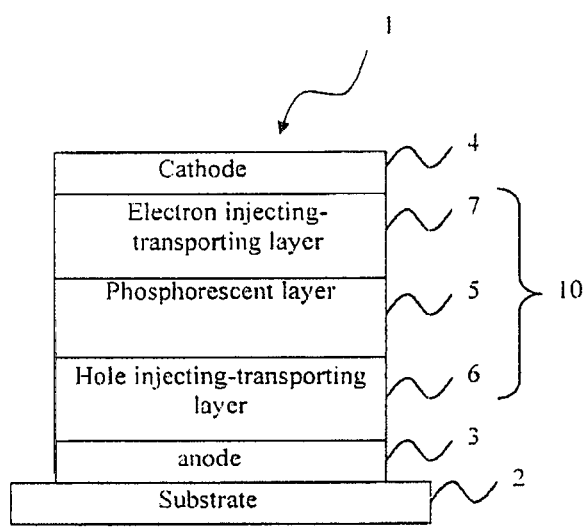

ORGANIC LIGHT EMITTING DEVICE AND MATERIALS FOR USE IN SAME

CROSS REFERENCE TO RELATED APPLICATION

The present application is a National Stage application, filed under 35 U.S.C. §371, of International Application No. PCT/US10/41177, filed Jul. 7, 2010.

BACKGROUND OF THE INVENTION

The present invention relates to an organic light emitting device (hereinafter abbreviated as an OLED) and materials capable of being used in such an OLED. In particular, it relates to an OLED which comprises a light emitting layer which emits a red light, and materials for an OLED which are used for the same.

RELATED ART

OLEDs which comprise an organic thin film layer which includes a light emitting layer located between an anode and a cathode are known in the art. In such devices, emission of light may be obtained from exciton energy, produced by recombination of a hole injected into a light emitting layer with an electron.

Generally, OLEDs are comprised of several organic layers in which at least one of the layers can be made to electroluminesce by applying a voltage across the device (see, e.g., Tang, et al., Appl. Phys. Lett. 1987, 51, 913 and Burroughes, et al., Nature, 1990, 347, 359). When a voltage is applied across a device, the cathode effectively reduces the adjacent organic layers (i.e., injects electrons), and the anode effectively oxidizes the adjacent organic layers (i.e., injects holes). Holes and electrons migrate across the device toward their respective oppositely charged electrodes. When a hole and electron meet on the same molecule, recombination is said to occur, and an exciton is formed. Recombination of the hole and electron in luminescent compounds is accompanied by radiative emission, thereby producing electroluminescence.

Depending on the spin states of the hole and electron, the exciton resulting from hole and electron recombination can have either a triplet or singlet spin state. Luminescence from a singlet exciton results in fluorescence, whereas luminescence from a triplet exciton results in phosphorescence. Statistically, for organic materials typically used in OLEDs, one quarter of the excitons are singlets, and the remaining three-quarters are triplets (see, e.g., Baldo, et al., Phys. Rev. B, 1999, 60, 14422). Until the discovery that there were certain phosphorescent materials that could be used to fabricate practical electro-phosphorescent OLEDs (U.S. Pat. No. 6,303,238) and, subsequently, demonstration that such electro-phosphorescent OLEDs could have a theoretical quantum efficiency of up to 100% (i.e., harvesting all of both triplets and singlets), the most efficient OLEDs were typically based on materials that fluoresced. Fluorescent materials luminesce with a maximum theoretical quantum efficiency of only 25% (where quantum efficiency of an OLED refers to the efficiency with which holes and electrons recombine to produce luminescence), since the triplet to ground state transition of phosphorescent emission is formally a spin forbidden process. Electro-phosphorescent OLEDs have now been shown to have superior overall device efficiencies as compared with electro-fluorescent OLEDs (see, e.g., Baldo, et al., Nature, 1998, 395, 151 and Baldo, et al., Appl. Phys. Lett. 1999, 75(3), 4).

Due to strong spin-orbit coupling that leads to singlet-triplet state mixing, heavy metal complexes often display efficient phosphorescent emission from such triplets at room temperature. Accordingly, OLEDs comprising such complexes have been shown to have internal quantum efficiencies of more than 75% (Adachi, et al., Appl. Phys. Lett., 2000, 77, 904). Certain organometallic iridium complexes have been reported as having intense phosphorescence (Lamansky, et al., Inorganic Chemistry, 2001, 40, 1704), and efficient OLEDs emitting in the green to red spectrum have been prepared with these complexes (Lamansky, et al., J. Am. Chem. Soc., 2001, 123, 4304). Phosphorescent heavy metal organometallic complexes and their respective devices have been the subject of U.S. Pat. Nos. 6,830,828 and 6,902,830; U.S. Publications 2006/0202194 and 2006/0204785; and U.S. Pat. Nos. 7,001,536; 6,911,271; 6,939,624; and 6,835,469.

OLEDs, as described above, generally provide excellent luminous efficiency, image quality, power consumption and the ability to be incorporated into thin design products such as flat screens, and therefore hold many advantages over prior technology, such as cathode ray devices.

However, improved OLEDs, including, for example, the preparation of OLEDs having greater current efficiency are desirable. In this regard, light emitting materials (phosphorescent materials) have been developed in which light emission is obtained from a triplet exciton in order to enhance internal quantum efficiency.

As discussed above, such OLEDs can have a theoretical internal quantum efficiency up to 100% by using such phosphorescent materials in the light emitting layer (phosphorescent layer), and the resulting OLED will have a high efficiency and low power consumption. Such phosphorescent materials may be used as a dopant in a host material which comprises such a light emitting layer.

In a light emitting layer formed by doping with a light emitting material such as a phosphorescent material, excitons can efficiently be produced from a charge injected into a host material. Exciton energy of an exciton produced may be transferred to a dopant, and emission may be obtained from the dopant at high efficiency. Exitons may be formed either on the host materials or directly on the dopant.

In order to achieve intermolecular energy transfer from a host material to a phosphorescent dopant with high device efficiencies, the excited triplet energy EgH of the host material must be greater than the excited triplet energy EgD of the phosphorescent dopant.

In order to carry out intermolecular energy transfer from a host material to a phosphorescent dopant, an excited triplet energy Eg (T) of the host material has to be larger than an excited triplet energy Eg (S) of the phosphorescent dopant.

CBP (4,4'-bis(N-carbazolyl)biphenyl) is known to be a representative example of a material having an efficient and large excited triplet energy. See, e.g., U.S. Pat. No. 6,939,624.

If CBP is used as a host material, energy can be transferred to a phosphorescent dopant having a prescribed emission wavelength, such as red, and an OLED having a high efficiency can be obtained.

When CBP is used as a host material, the luminous efficiency is notably enhanced by phosphorescent emission. Conversely, CBP is known to have a very short lifetime, and therefore it is not suitable for practical use.

Without being bound by scientific theory, it is believed that this is because CBP may be heavily deteriorated by a hole due to its oxidative stability not being high, in terms of molecular structure.

International Patent Application Publication WO 2005/112519 discloses a technique in which a condensed ring derivative having a nitrogen-containing ring such as carbazole and the like is used as a host material for a phosphorescent layer showing red phosphorescence. The current efficiency and the lifetime are improved by the above technique, but it is not satisfactory in a certain case for practical use.

On the other hand, a wide variety of host materials (fluorescent hosts) for a fluorescent dopant showing fluorescent emission are known, and various host materials can be proposed which, by combination with a fluorescent dopant, may form a fluorescent layer which exhibits excellent luminous efficiency and lifetime.

In a fluorescent host, an excited singlet energy Eg (S) is larger than in a fluorescent dopant, but an excited triplet energy Eg (T) of such a host is not necessarily larger. Accordingly, a fluorescent host cannot simply be used in place of a phosphorescent host as a host material to provide a phosphorescent emitting layer.

For example, anthracene derivatives are known well as a fluorescent host.

However, an excited state triplet energy Eg (T) of anthracene derivatives may be as small as about 1.9 eV. Thus, energy transfer to a phosphorescent dopant having an emission wavelength in a visible light region of 500 nm to 720 nm cannot be achieved using such a host, since the excited state triplet energy would be quenched by a host having such a low triplet state energy. Accordingly, anthracene derivatives are unsuitable as a phosphorescent host.

Perylene derivatives, pyrene derivatives and naphthacene derivatives are not preferred as phosphorescent hosts for the same reason.

The use of aromatic hydrocarbon compounds as phosphorescent hosts is disclosed in Japanese Patent Application Laid-Open No. 142267/2003. That application discloses phosphorescent host compounds with a benzene skeleton core and with two aromatic substituents bonded at meta positions.

However, the aromatic hydrocarbon compounds described in Japanese Patent Application Laid-Open No. 142267/2003 assume a rigid molecular structure having a good symmetric property and provided with five aromatic rings in which molecules are arranged in a bilaterally symmetrical manner toward a central benzene skeleton. Such an arrangement has the drawback of a likelihood of crystallization of the light emitting layer.

On the other hand, OLEDs in which various aromatic hydrocarbon compounds are used are disclosed in International Patent Application Publications WO 2007/046685; Japanese Patent Application Laid-Open No. 151966/2006; Japanese Patent Application Laid-Open No. 8588/2005; Japanese Patent Application Laid-Open No. 19219/2005; Japanese Patent Application Laid-Open No. 19219/2005; and Japanese Patent Application Laid-Open No. 75567/2004. However, the efficiency of these materials as a phosphorescent host is not disclosed.

In addition, OLEDs prepared by using various fluorene compounds are disclosed in Japanese Patent Application Laid-Open No. 043349/2004; Japanese Patent Application Laid-Open No. 314506/2007; and Japanese Patent Application Laid-Open No. 042485/2004. However, the effectiveness of these materials as a phosphorescent host is not disclosed.

Further, Japanese Patent Application Laid-Open No. 042485/2004 discloses hydrocarbon compounds in which a condensed polycyclic aromatic ring is bonded directly to a fluorene ring. However, the effectiveness of an OLED prepared by combining such materials with a phosphorescent material is not disclosed, and the application discloses perylene and pyrene rings which are known to have a small triplet energy level as condensed polycyclic aromatic rings, and which are not preferred for use as a light emitting layer of a phosphorescent device, and materials which are effective for a phosphorescent device are not selected.

Despite the recent discoveries of efficient heavy metal phosphors and the resulting advancements in OLED technology, there remains a need for even greater high temperature device stability. In addition, there still remains a need for host materials which can transfer energy to a phosphorescent material with high efficiency and with an extended lifetime. Fabrication of devices that have longer high temperature lifetimes will contribute to the development of new display technologies and help realize the current goals toward full color electronic display on flat surfaces. The OLEDs and the host materials and phosphorescent emitter materials comprised in such OLEDs, described herein, help fulfill this objective.

SUMMARY OF THE INVENTION

The OLEDs of the present invention are characterized by providing an organic thin film layer comprising a single layer or plural layers between a cathode and an anode, wherein the organic thin film layer comprises at least one organic light emitting layer, wherein at least one light emitting layer comprises at least one host material and at least one phosphorescent emitter material, wherein the host material comprises a substituted or unsubstituted hydrocarbon compound having the chemical structure represented by the formula (A-1):

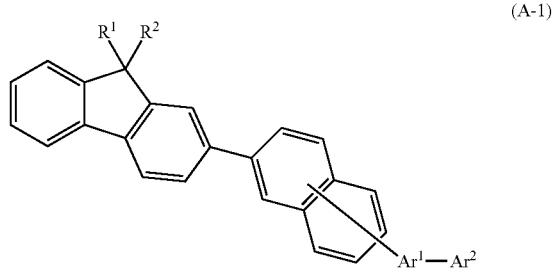

(A-1)

wherein $R^1$ and $R^2$ each represent independently a substituted or unsubstituted alkyl group having from 1 to about 5 carbon atoms; $Ar^1$ represents a divalent residue of a benzene ring, a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or a picene ring; and $Ar^2$ represents a monovalent residue of a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or a picene ring; and $Ar^1$ and $Ar^2$ each may have independently one or plural substituent(s) selected from the group consisting of an alkyl group having 1 to about 3 carbon atoms, a cycloalkyl group having about 5 to about 7 ring-forming carbon atoms, a silyl group having about 3 to about 12 carbon atoms, a cyano group, a halogen atom and an aryl group having about 6 to about 16 ring-forming carbon atoms.

In another embodiment, the OLED comprises a host material wherein $Ar^1$ is a divalent residue of a benzene ring, and $Ar^2$ is a monovalent residue of a fluoranthene ring, and the host material has the chemical structure represented by the formula (A-1-42):

(A-1-42)

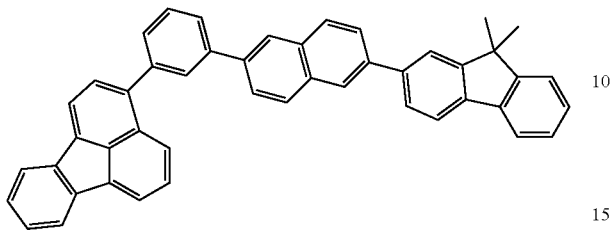

In one embodiment of the present invention, the phosphorescent emitter material comprises a phosphorescent organometallic complex having a substituted chemical structure represented by one of the following partial chemical structures represented by the following Formulas (B-1), (B-2) and (B-3):

(B-1)

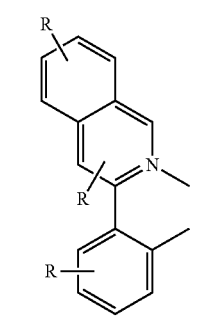

(B-2)

(B-3)

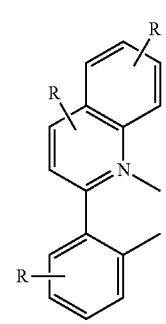

wherein R is methyl. The phosphorescent organometallic complex according to the above structure may be substituted with any suitable number of methyl groups. In one embodiment, the phosphorescent organometallic complex according to the above structure is substituted with at least two methyl groups.

In another embodiment, the phosphorescent emitter material comprises a phosphorescent organometallic complex having a substituted chemical structure represented by the following partial chemical structure (3):

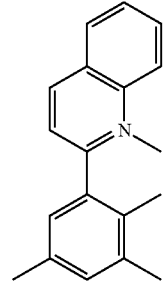

In another embodiment, the phosphorescent emitter material comprises a metal complex, and the metal complex comprises a metal atom selected from Ir, Pt, Os, Au, Cu, Re and Ru and a ligand. In yet another embodiment the metal complex has an ortho-metal bond. In preferred embodiments, Ir is the metal atom.

In another embodiment, the phosphorescent emitter material comprises a phosphorescent organometallic compound having a substituted chemical structure represented by the following chemical structure (4):

(4)

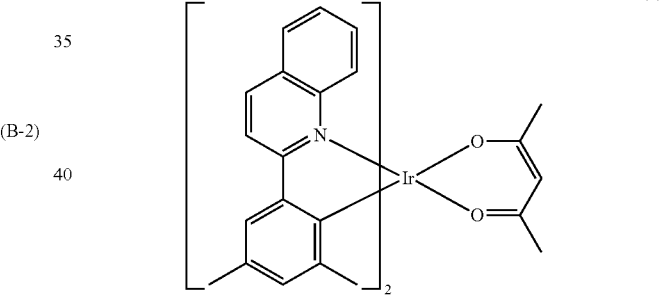

In another embodiment, the present invention comprises an OLED which comprises a host material which comprises an unsubstituted aromatic hydrocarbon compound having the chemical structure represented by the formula:

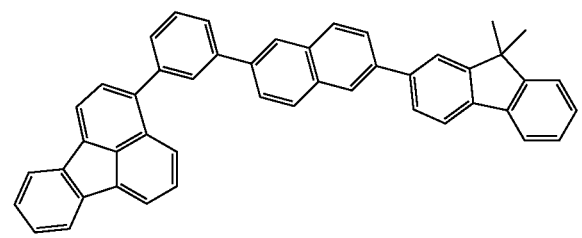 [SMILES: CC1(C)c2ccccc2-c2ccc(-c3ccc4cc(-c5cccc(-c6ccc7c8c(cccc68)-c6ccccc6-7)c5)ccc4c3)cc21]

and a phosphorescent emitter material which comprises a phosphorescent organometallic compound having a substituted chemical structure represented by the following chemical structure (4):

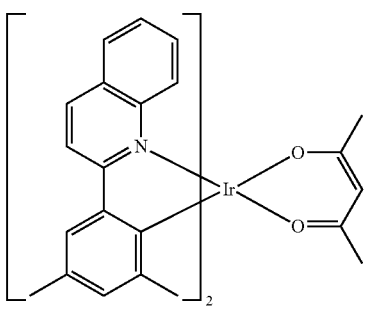

(4)

In another embodiment, the present invention comprises an OLED which comprises a host material which comprises an unsubstituted aromatic hydrocarbon compound having the chemical structure represented by the formula:

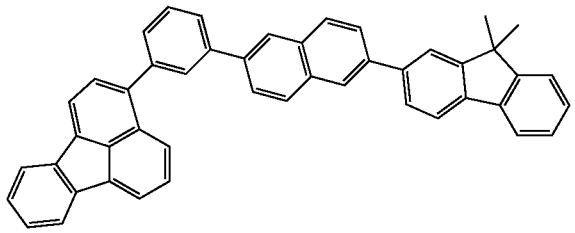 [SMILES: CC1(C)c2ccccc2-c2ccc(-c3ccc4cc(-c5cccc(-c6ccc7c8c(cccc68)-c6ccccc6-7)c5)ccc4c3)cc21]

and a phosphorescent emitter material which comprises a phosphorescent organometallic compound having a substituted chemical structure represented by the following chemical structure (5):

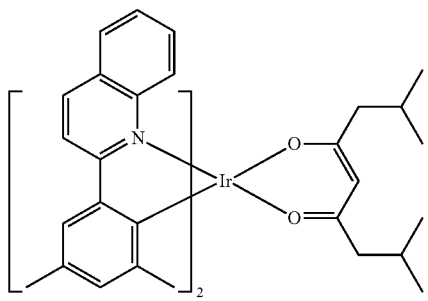

(5)

In one embodiment, the present invention comprises an OLED which comprises a host material, wherein the triplet energy of the host material is from about 2.0 eV to about 2.8 eV.

In another embodiment, the present invention comprises an OLED which comprises at least one phosphorescent material in the light emitting layer, wherein the phosphorescent material has a maximum value of 500 nm or more and 720 nm or less in a light emitting wavelength.

In another embodiment, the present invention comprises an OLED which provides improved voltage and working lifetime characteristics. Without being bound by theory, it is believed that improved characteristics of the OLEDs of the present invention may be achieved due to the serial bonding of two or more condensed polycyclic aromatic rings to a monovalent fluorene skeleton and by bonding a group containing condensed polycyclic aromatic rings which are different from each other to a fluorene skeleton in a position in which a conjugate length is extended.

In another embodiment, the present invention comprises a phosphorescent OLED having high efficiency and long lifetime, which OLED comprises a material of general Formula (A-1) as a host material, and particularly as a phosphorescent host material.

BRIEF DESCRIPTION OF THE DRAWING

FIG. 1 is a drawing showing an outline constitution of one example of the OLED in the embodiment of the present invention.

EXPLANATIONS OF THE CODES

1 OLED
2 Substrate
3 Anode
4 Cathode
5 Phosphorescence emitting layer
6 Hole injecting•transporting layer
7 Electron injecting•transporting layer
10 Organic thin film layer The OLEDs of the present invention may comprise a plurality of layers located between an anode and a cathode. Representative OLEDs according to the invention include, but are not limited to, structures having constituent layers as described below:

(1) Anode/light emitting layer/cathode;
(2) Anode/hole injecting layer/light emitting layer/cathode;
(3) Anode/light emitting layer/electron injecting•transporting layer/cathode;
(4) Anode/hole injecting layer/light emitting layer/electron injecting•transporting layer/cathode;
(5) Anode/organic semiconductor layer/light emitting layer/cathode;
(6) Anode/organic semiconductor layer/electron blocking layer/light emitting layer/cathode;
(7) Anode/organic semiconductor layer/light emitting layer/adhesion improving layer/cathode;
(8) Anode/hole injecting•transporting layer/light emitting layer/electron injecting•transporting layer/cathode;
(9) anode/insulating layer/light emitting layer/insulating layer/cathode;
(10) anode/inorganic semiconductor layer/insulating layer/light emitting layer/insulating layer/cathode;
(11) anode/organic semiconductor layer/insulating layer/light emitting layer/insulating layer/cathode;
(12) anode/insulating layer/hole injecting•transporting layer/light emitting layer/insulating layer/cathode; and
(13) anode/insulating layer/hole injecting•transporting layer/light emitting layer/electron injecting•transporting layer/cathode.

Among the OLED constituent structures described above, constitution structure number 8 is a preferred structure, but the present invention is not limited to these disclosed constituent structures.

A schematic constitution of one example of an OLED in an embodiment of the present invention is shown in FIG. 1.

As a representative embodiment of the invention, an OLED 1 comprises a transparent substrate 2, an anode 3, a cathode 4 and an organic thin film layer 10 disposed between the anode 3 and the cathode 4.

The organic thin film layer 10 comprises a phosphorescence emitting layer 5 containing a phosphorescent host and a phosphorescent dopant, and can provide respectively a hole injecting•transporting layer 6 and the like between the phosphorescence emitting layer 5 and the anode 3, and an electron injecting•transporting layer 7 and the like between the phosphorescence emitting layer 5 and the cathode 4.

Further, there may be provided respectively an electron blocking layer disposed between the anode 3 and the phosphorescence emitting layer 5, and a hole blocking layer disposed between the cathode 4 and the phosphorescence emitting layer 5.

This makes it possible to contain electrons and holes in the phosphorescence emitting layer 5 to enhance the production rate of excitons in the phosphorescence emitting layer 5.

In the present specification, the terms "fluorescent host" and "phosphorescent host" are referred to as a fluorescent host when combined with a fluorescent dopant and as a phosphorescent host when combined with a phosphorescent dopant, respectively, and should not be limited to a classification of the host material based solely on molecular structure.

Accordingly, a fluorescent host in the present specification means a material constituting the fluorescence emitting layer containing a fluorescent dopant and does not mean a material which can be used only for a host of a fluorescent material.

Similarly, a phosphorescent host means a material constituting the phosphorescence emitting layer containing a phosphorescent dopant and does not mean a material which can be used only for a host of a phosphorescent material.

In the present specification, "a hole injecting•transporting layer" means at least either one of a hole injecting layer and a hole transporting layer, and "an electron injecting•transporting layer" means at least either one of an electron injecting layer and an electron transporting layer.

Substrate

The OLED of the present invention may be prepared on a substrate. The substrate referred to in this case is a substrate for supporting the OLED, and it is preferably a flat substrate in which light in the visible region of about 400 to about 700 nm has a transmittance of at least about 50%.

The substrate may include a glass plate, a polymer plate and the like. In particular, the glass plate may include soda lime glass, barium•strontium-containing glass, lead glass, aluminosilicate glass, borosilicate glass, barium borosilicate glass, quartz and the like.

The polymer plate may include polycarbonate, acryl, polyethylene terephthalate, polyether sulfide, polysulfone and the like.

Anode and Cathode

An anode in the OLED of the present invention assumes the role of injecting a hole into the hole injecting layer, the hole transporting layer or the light emitting layer. Typically the anode has a work function of 4.5 eV or more.

Specific examples of a material suitable for use as the anode include indium tin oxide alloy (ITO), tin oxide (NESA), indium zinc oxide, gold, silver, platinum, copper and the like.

The anode can be prepared by forming a thin film from electrode substances, such as those discussed above, by a method such as a vapor deposition method, a sputtering method and the like.

When light is emitted from the light emitting layer, the transmittance of light in the visible light region in the anode is preferably larger than 10%. The sheet resistance of the anode is preferably several hundred Ω/square or less. The film thickness of the anode is selected, depending on the material, and is typically in the range of from about 10 nm to about 1 μm, and preferably from about 10 nm to about 200 nm.

The cathode comprises preferably a material having a small work function for the purpose of injecting an electron into the electron injecting layer, the electron transporting layer or the light emitting layer.

Materials suitable for use as the cathode include, but are not limited to indium, aluminum, magnesium, magnesium-indium alloys, magnesium-aluminum alloys, aluminum-lithium alloys, aluminum-scandium-lithium alloys, magnesium-silver alloys and the like. For transparent or top-emitting devices, a TOLED cathode such as disclosed in U.S. Pat. No. 6,548,956 is preferred.

The cathode can be prepared, as is the case with the anode, by forming a thin film by a method such as a vapor deposition method, a sputtering method and the like. Further, an embodiment in which light emission is taken out from a cathode side can be employed as well.

Light Emitting Layer

The light emitting layer in the OLED may be capable of carrying out the following functions singly or in combination:

(1) injecting function: a function in which a hole can be injected from an anode or a hole injecting layer in applying an electric field and in which an electron can be injected from a cathode or an electron injecting layer;

(2) transporting function: a function in which a charge (electron and hole) injected may be transferred by virtue of a force of an electric field; and (3) light emitting function: a function in which a region for recombination of an electron and a hole may be provided, and which results in the emission of light.

A difference may be present between ease of injection of a hole and ease of injection of an electron, and a difference may be present in the transporting ability shown by the mobilities of a hole and an electron.

Known methods including, for example, vapor deposition, spin coating, Langmuir Blodgett methods and the like can be used to prepare the light emitting layer. The light emitting layer is preferably a molecularly deposited film. In this regard, the term "molecularly deposited film" means a thin film formed by depositing a compound from the gas phase and a film formed by solidifying a material compound in a solution state or a liquid phase state, and usually the above-referenced molecular deposit film can be distinguished from a thin film (molecular accumulation film) formed by an LB method by a difference in an aggregation structure and a higher order structure and a functional difference originating in it.

In preferred embodiments, the film thickness of the light emitting layer is preferably from about 5 to about 50 nm, more preferably from about 7 to about 50 nm and most preferably from about 10 to about 50 nm. If the film thickness is less than 5 nm, it is likely to be difficult to form the light emitting layer and control the chromaticity. On the other hand, if it exceeds about 50 nm, the operating voltage is likely to go up.

OLEDs

In an OLED of the present invention, an organic thin film layer comprising one layer or plural layers is provided between a cathode and an anode; the above organic thin film layer comprises at least one light emitting layer; and at least one of the organic thin film layers contains at least one phosphorescent material and at least one host material as described below. Further, at least one of the light emitting layers contains preferably at least one host material of the present invention for an organic electroluminescence device and at least one phosphorescent material.

In the present invention, the light emitting layer comprises at least one phosphorescent material capable of phosphorescence emission, and a host material represented by the following Formula (A-1):

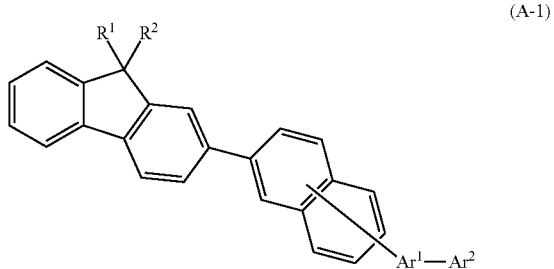

(A-1)

In Formula A-1 described above, $R^1$ and $R^2$ each represent independently a substituted or unsubstituted alkyl group having from 1 to about 5 carbon atoms; $Ar^1$ represents a divalent residue of a benzene ring, a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or a picene ring; and $Ar^2$ represents a monovalent residue of a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or a picene ring; and $Ar^1$ and $Ar^2$ each may have independently one or plural substituent(s) selected from the group consisting of an alkyl group having 1 to about 3 carbon atoms, a cycloalkyl group having about 5 to about 7 ring-forming carbon atoms, a silyl group having about 3 to about 12 carbon atoms, a cyano group, a halogen atom and an aryl group having about 6 to about 16 ring-forming carbon atoms.

When one or more of groups $Ar^1$, $Ar^2$, $R^1$, and $R^2$ in the above Formula (A-1) have one or plural substituents, the substituent is preferably selected from the group consisting of an alkyl group having 1 to about 3 carbon atoms, a cycloalkyl group having about 5 to about 7 ring-forming carbon atoms, a silyl group having about 3 to about 12 carbon atoms, a cyano group, a halogen atom and an aryl group having about 6 to about 16 ring-forming carbon atoms.

The substituents do not contain nitrogen atoms. Without being bound by scientific theory, it is believed that the absence of nitrogen atoms in the substituents results in enhanced stability and extended lifetime of the host material.

When one or more of groups $Ar^1$, $Ar^2$, $R^1$, and $R^2$ in the above Formula (A-1) has an aryl substituents, each of groups $Ar^1$, $Ar^2$, $R^1$, and $R^2$ preferably has 2 or less aryl substituents, and more preferably 1 or less.

The alkyl group having 1 to about 3 carbon atoms described above includes, for example, methyl, ethyl, propyl, isopropyl and the like.

The cycloalkyl group having about 5 to about 7 ring-forming carbon atoms described above includes, for example, cyclopentyl, cyclohexyl, 3,5-dimethyl cyclohexyl and the like.

The silyl group having about 3 to about 18 carbon atoms described above is preferably, for example, an alkylsilyl group, an arylsilyl group or an aralkylsilyl group, and examples thereof include trimethylsilyl, triethylsilyl, tributhylsilyl, dimethylethylsilyl, dimethylpropylsilyl, dimethylisopropylsilyl, dimethylbuthylsilyl, dimethyl-t-buthylsilyl, diethylisopropylsilyl, phenyldimethylsilyl, diphenylmethylsilyl, diphenyl-t-buthylsilyl, triphenylsilyl and the like.

The halogen atom includes a fluorine atom, a chlorine atom, a bromine atom and an iodine atom.

The aryl group having about 6 to about 16 ring-forming carbon atoms described above is preferably, phenyl, biphenyl, terphenyl, naphthyl, fluoranthenyl, 9,10-dialkylfluorenyl, phenanthrenyl and dibennzofuranyl and the like. More preferably the aryl group contains 6 to 14 ring-forming carbon atoms, and includes, for example, phenyl, biphenyl, naphthyl, phenanthrenyl and dibenzofuranyl and the like.

The host material represented by Formula (A-1) described above has a large excited triplet energy gap (excited triplet energy), and therefore it can transfer energy to the phosphorescent dopant to carry out phosphorescence emission.

A thin film for an OLED which demonstrates excellent stability can be formed by selecting a suitable ring structure, and using the ring structure together with a red phosphorescent material in order to provide a device having high efficiency and long lifetime.

Anthracene derivatives, which are well known fluorescent host materials, are typically unsuitable as host materials for a phosphorescent dopant for red light emission. However, the host of the present invention has a large excited triplet energy gap and therefore makes it possible to allow a phosphorescent dopant which displays red light emission to effectively emit light.

CBP, which is well known as a phosphorescent host, functions as a host for phosphorescent dopants which have wavelengths greater than that of green light. The host materials of the present invention allow for light emission in phosphorescent dopants which exhibit emission at wavelengths above green light emission.

In the present invention, employing a polycyclic condensed ring containing no nitrogen atom as the skeleton of the host material makes it possible to enhance the stability of the host molecules and extend the device lifetime.

In this case, if the skeleton part has too small a number of ring carbon atoms, the stability of the molecules is not believed to be sufficiently enhanced.

In this case, if the skeleton portion of the host material has too small a number of ring carbon atoms, the stability of the molecules may not be sufficiently enhanced. On the other hand, if the polycyclic condensed ring has too many ring carbon atoms, the HOMO-LUMO gap may be narrowed, and an excited triplet energy gap may not produce a useful light emitting wavelength. In the present invention, the host material represented by Formula (I) described above provides a material which has a suitable number of ring carbon atoms and which therefore is suitable for use as a phosphorescent host for a phosphorescence emission layer having a useful light emitting wavelength and having a high stability, especially at higher operating temperatures.

Host materials corresponding to phosphorescent dopants which can widely be applied to phosphorescent dopants in a broad wavelength region of green to red colors are known, and therefore CBP and the like, which have a wide excited triplet energy gap, have been used for a host material. CBP has a wide excited triplet energy gap Eg(T) but is associated with the problem that may have a short lifetime.

In this regard, the host material of the present invention can not typically be applied to a host for a phosphorescent dopant having such a wide gap as that of blue wavelength light, but it may function as a host for a phosphorescent dopant at wavelengths of, for example, red or green light. Further, if the excited triplet energy gap is broad, as is the case with CBP, the potential problem exists that intermolecular transfer of energy may not be efficiently carried out to a red phosphorescent dopant because of the large difference in energy gap. In the host materials described herein, however, since the energy gap maybe preferably selected in combination with red or green phosphorescent dopant, energy can efficiently be transferred to the phosphorescent dopant, and a phosphorescence emitting layer having a very high efficiency can be constituted.

As described above, a phosphorescence emitting layer having high efficiency and long lifetime can be prepared according to the teachings of the present invention, especially a high stability at high operating temperatures.

In this regard, an excited triplet energy gap Eg(T) of the material constituting the OLED of the invention may be prescribed based on its phosphorescence emission spectrum, and it is given as an example in the present invention that the energy gap may be prescribed, as is commonly used, in the following manner.

The respective materials are dissolved in an EPA solvent (diethyl ether:isopentane:ethanol=5:5:2 in terms of a volume ratio) in a concentration of 10 μmol/L to prepare a sample for measuring phosphorescence.

This phosphorescence measuring sample is placed in a quartz cell and cooled to 77 K, and is subsequently irradiated with exciting light to measure the wavelength of a phosphorescence emitted.

A tangent line is drawn based on the increase of phosphorescence emission spectrum thus obtained at the short wavelength side, and the wavelength value of the intersection point of the above tangent line and the base line is converted to an energy value, which is set as an excited triplet energy gap Eg(T).

A commercially available measuring equipment F-4500 (manufactured by Hitachi, Ltd.) can be used for the measurement.

However, a value which can be defined as the triplet energy gap can be used without depending on the above procedure as long as it does not deviate from the scope of the present invention.

A most preferred host material, wherein $Ar^1$ is a divalent residue of a benzene ring, and $Ar^2$ is a monovalent residue of a fluoranthene ring, and the host material has the chemical structure represented by the formula:

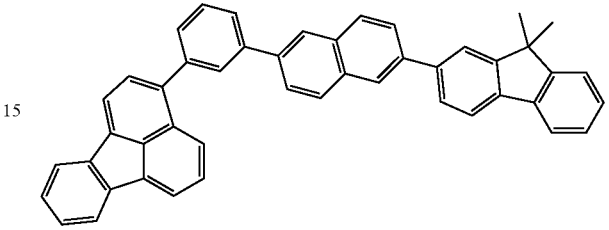

The materials of the present invention for an organic electroluminescence device have a large triplet energy gap (excited triplet energy), and therefore phosphorescent light can be emitted by transferring energy to a phosphorescent dopant.

In the present invention, the excited triplet energy of the host material described above is preferably from about 2.0 eV to about 2.8 eV.

The excited triplet energy of about 2.0 eV or more makes it possible to transfer energy to a phosphorescent material which emits light at a wavelength of 500 nm or more and 720 nm or less. The excited triplet energy of about 2.8 eV or less makes it possible to avoid the problem that light emission is not efficiently carried out in a red phosphorescent dopant because of the large difference in an energy gap.

The excited triplet energy of the host material is more preferably from about 2.1 eV to about 2.7 eV.

Specific examples of suitable compounds for the host material according to the present invention, represented by Formulas (A-1), include, but are not limited to, the following compounds:

1

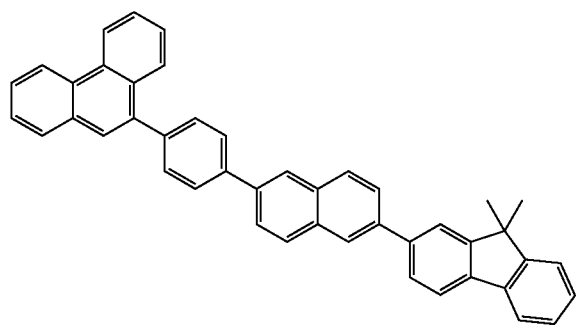

2

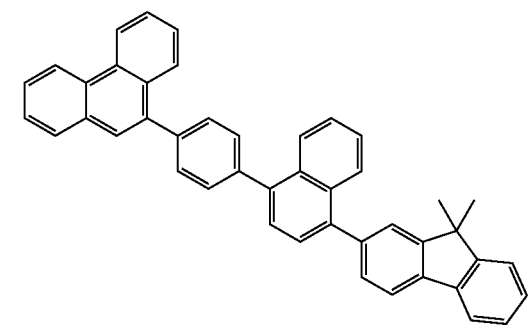

3

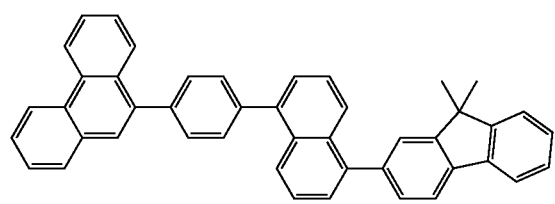

4

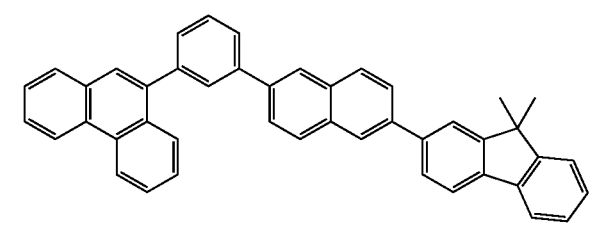

-continued
5
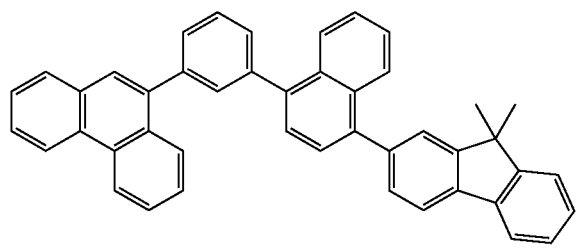
6
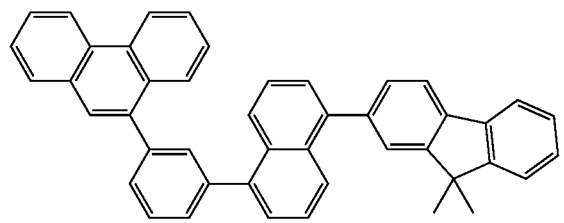
7
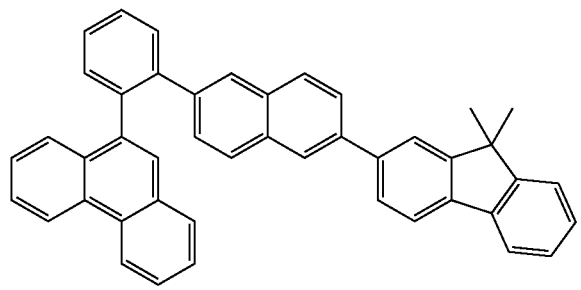
8
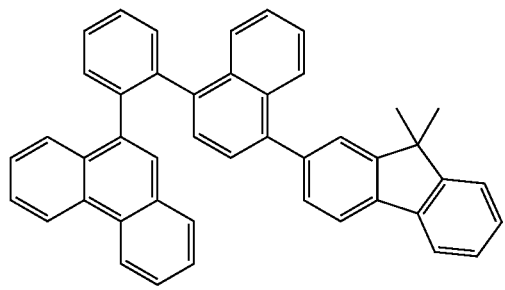
9
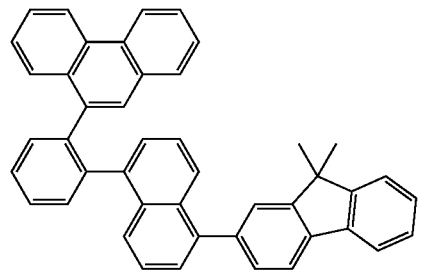
10
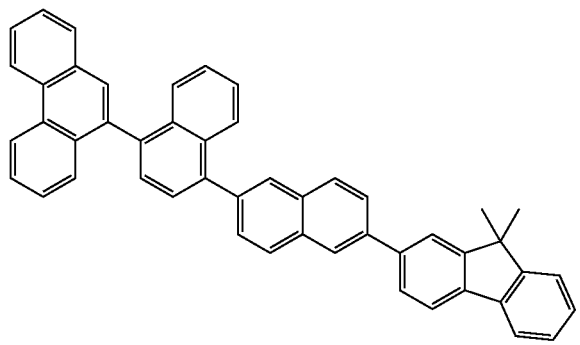
11
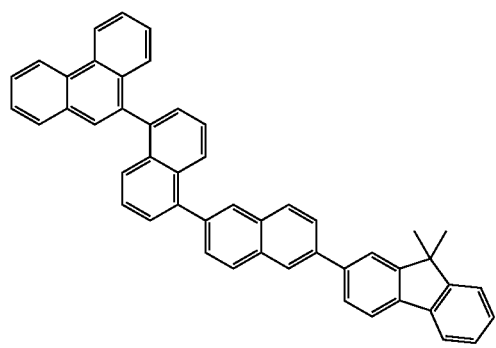
12
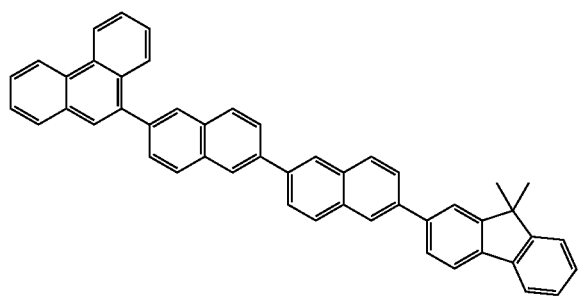

-continued
13
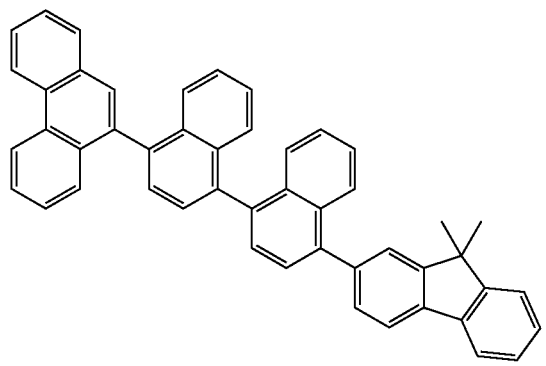
14
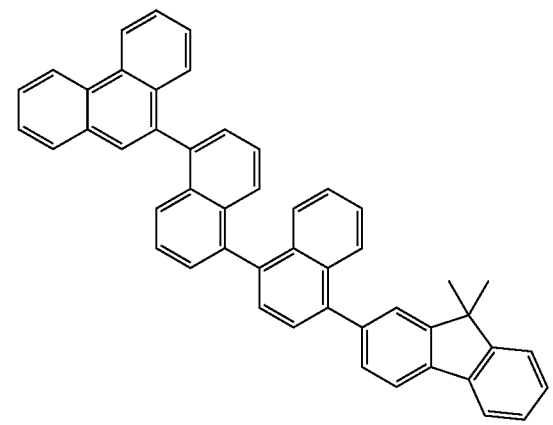
15
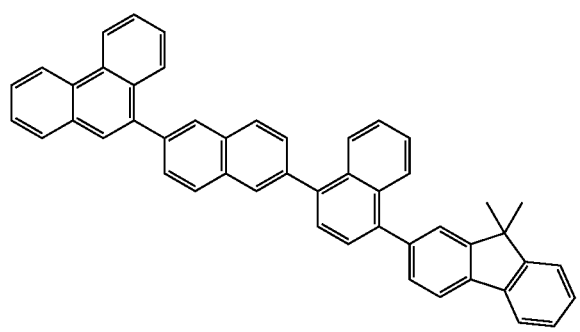
16
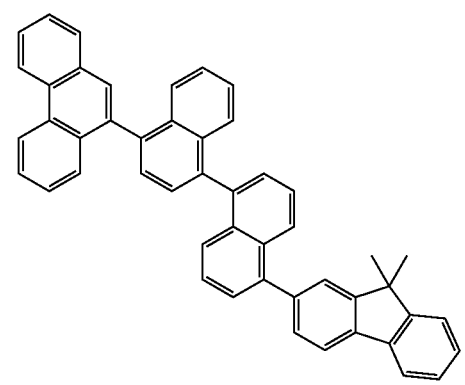
17
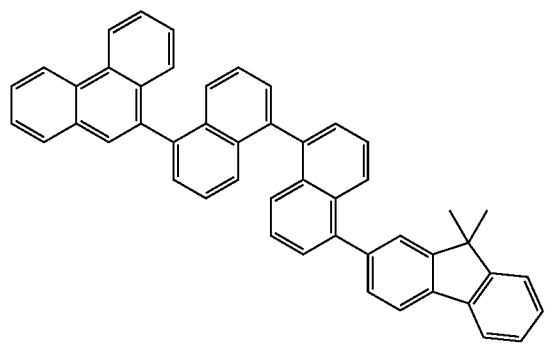
18
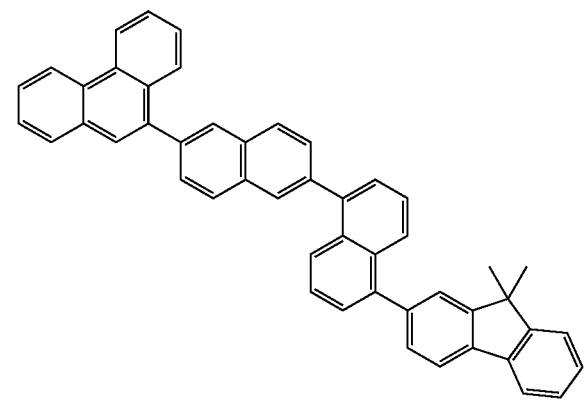
19
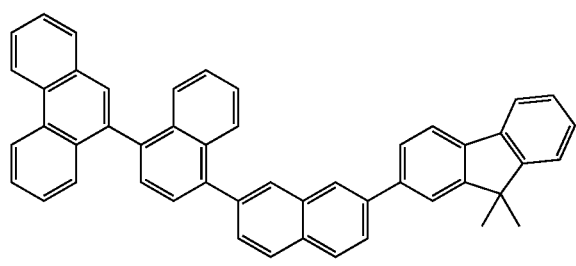
20
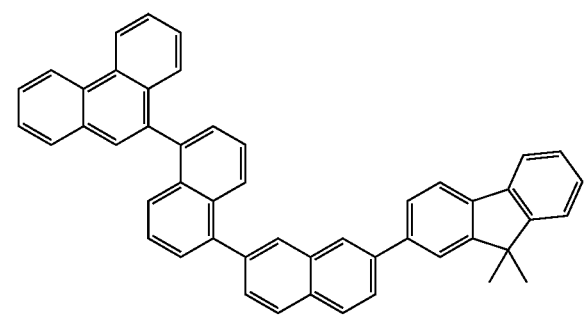

-continued
21
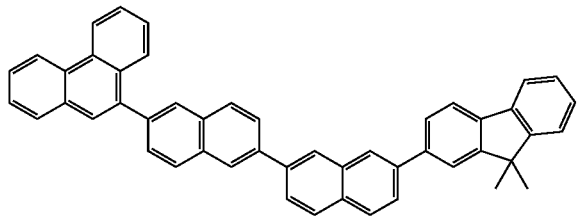
22
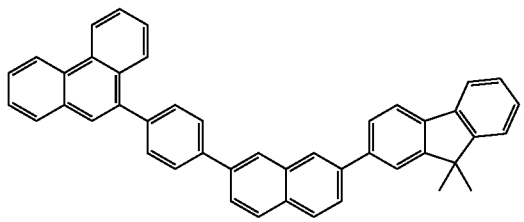
23
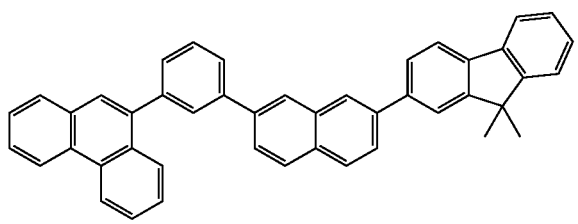
24
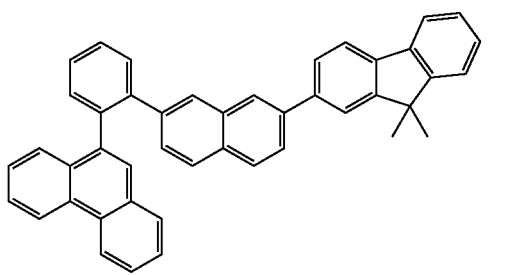
25
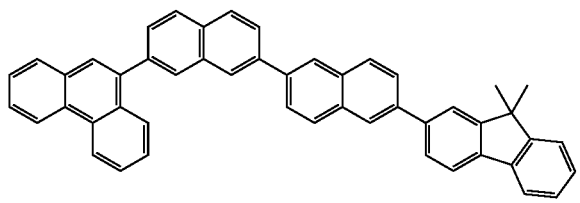
26
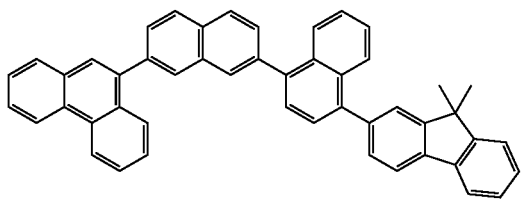
27
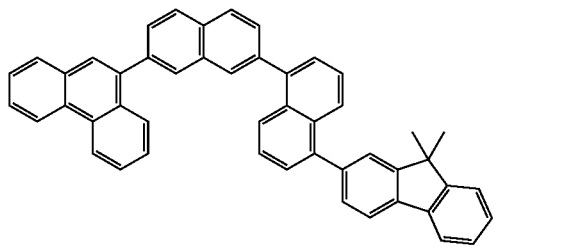
28
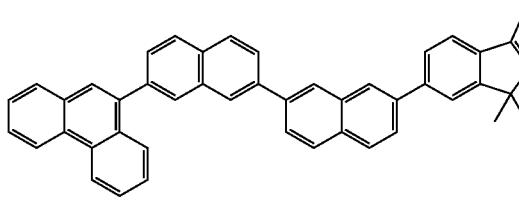
29
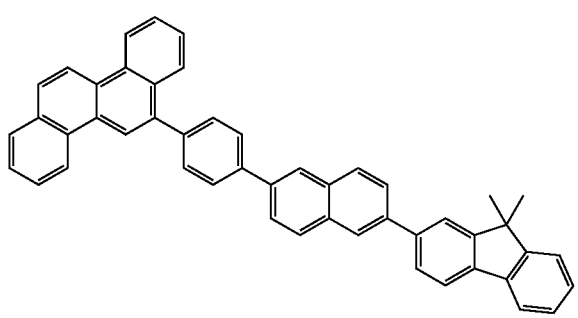
30
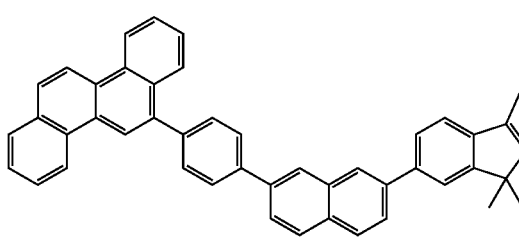
31
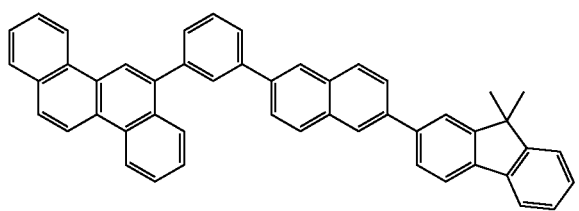
32
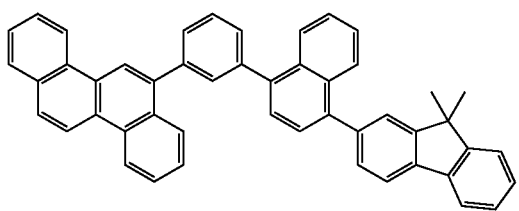

-continued
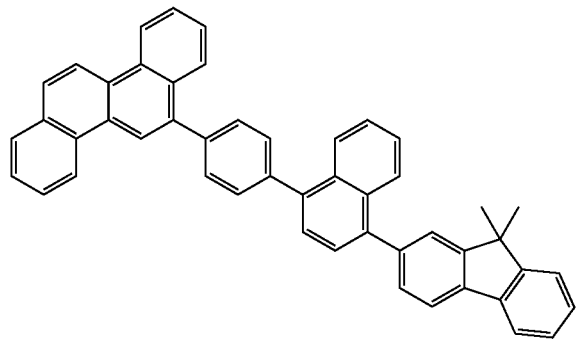

-continued
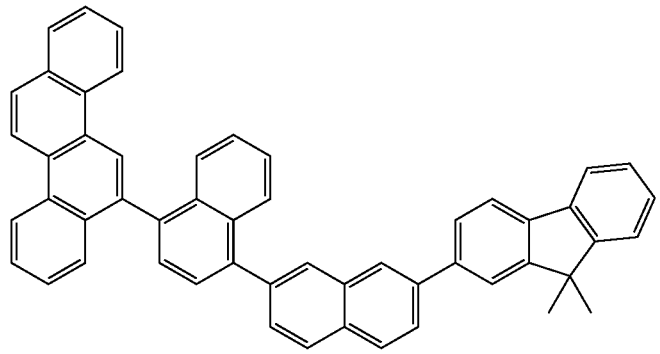
39
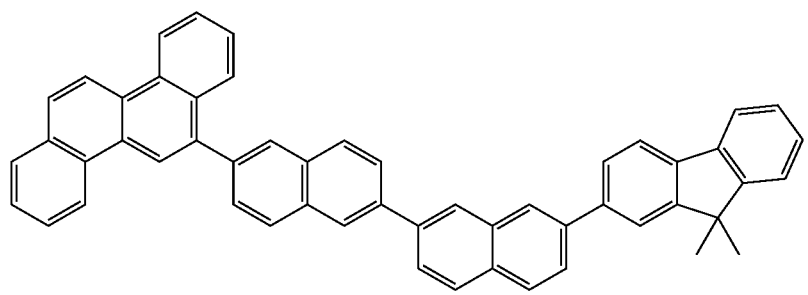
40
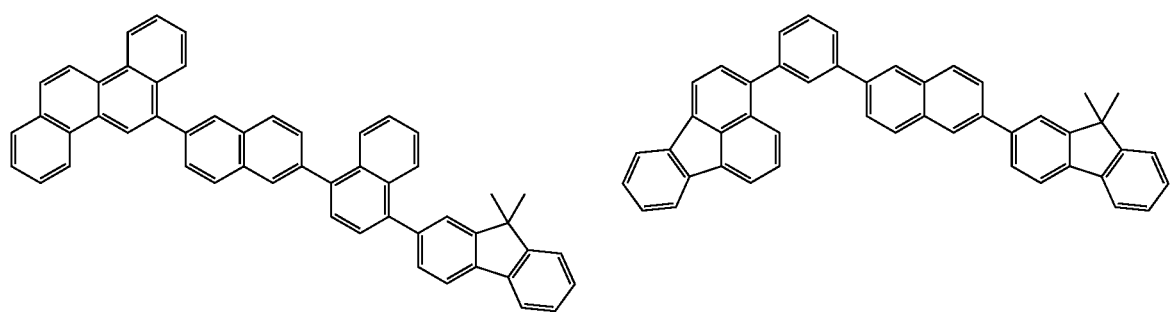
41 42
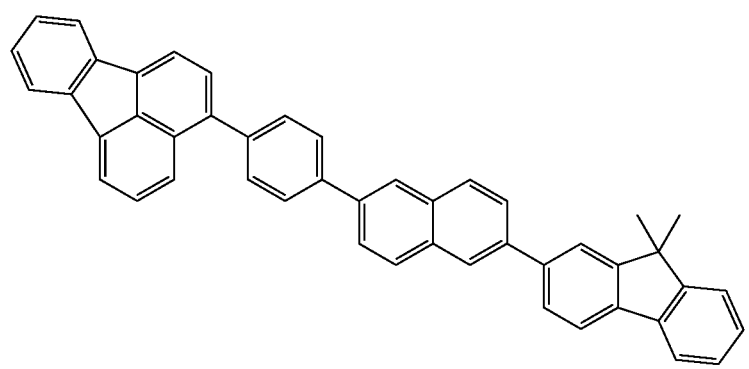
43
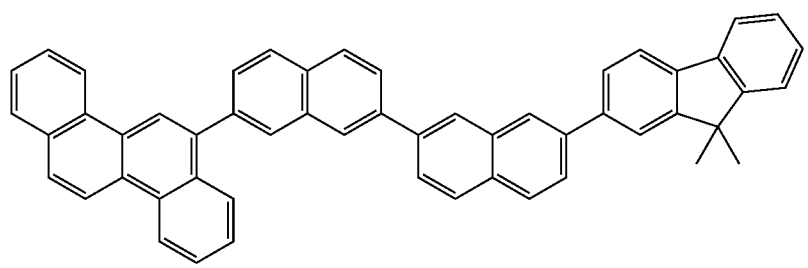
44

-continued
45
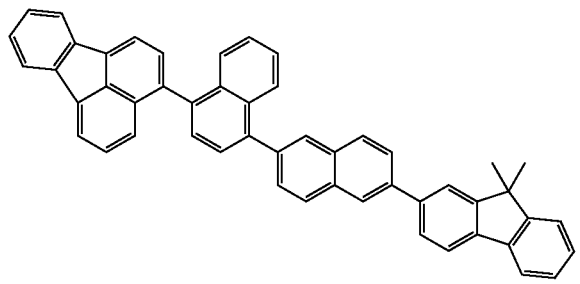
46
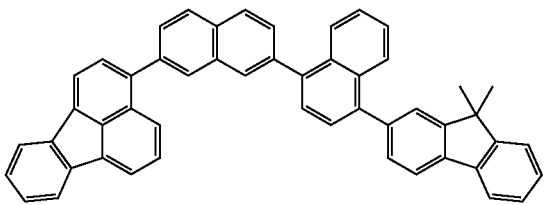
47
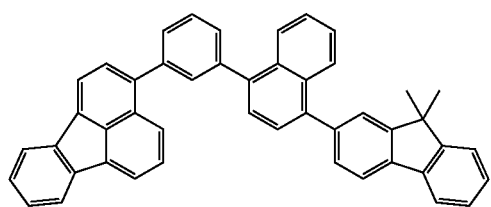
48
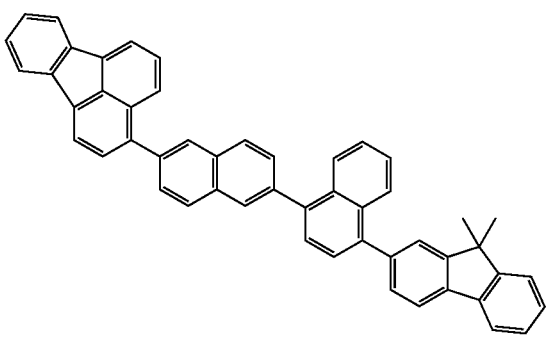
49
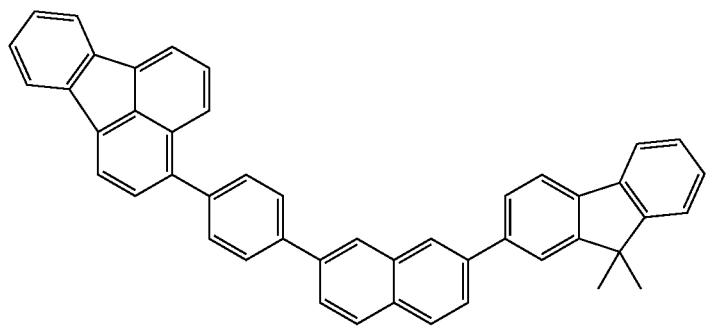
50
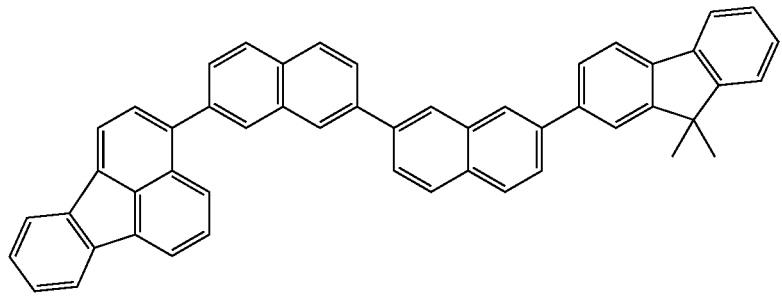
51
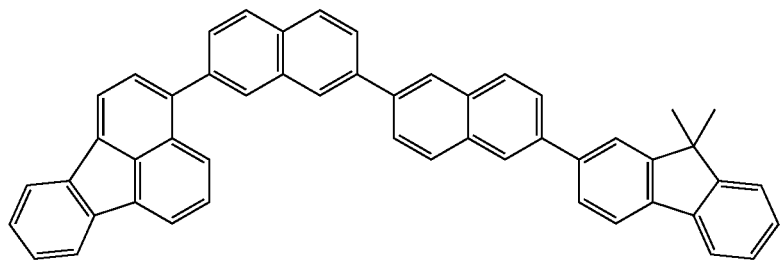

-continued
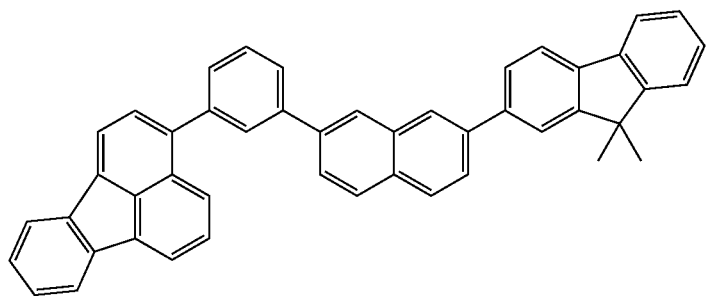
52
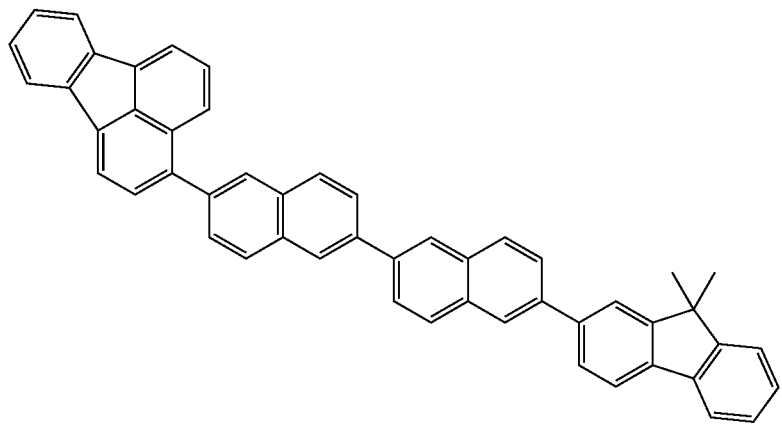
53
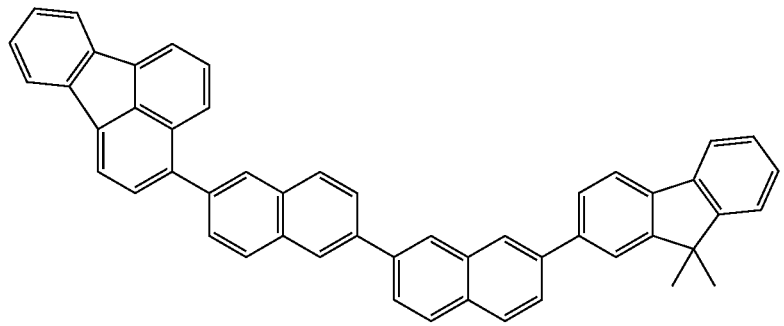
54
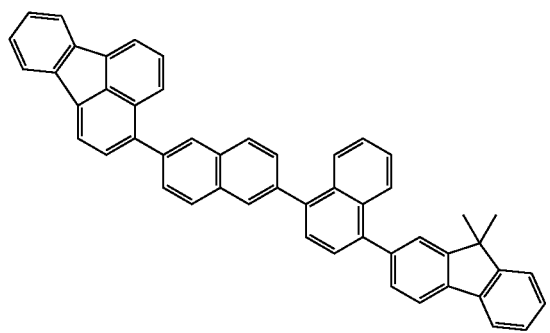
55
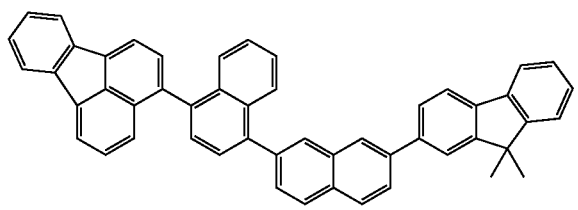
56

-continued
57
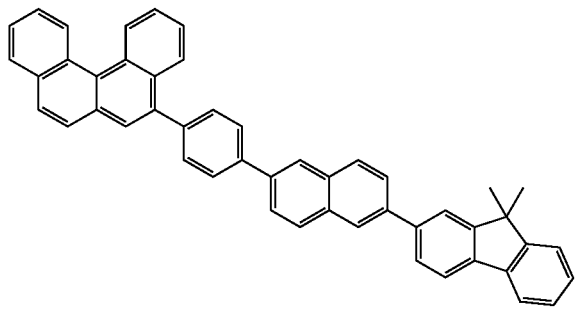
58
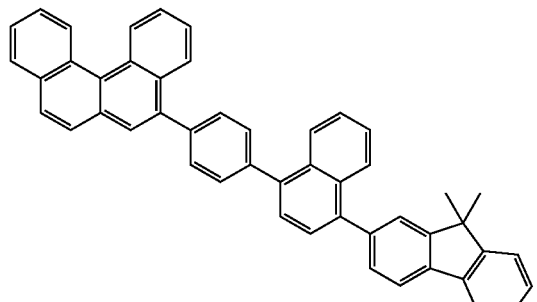
59
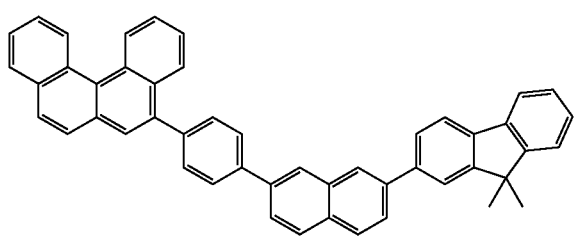
60
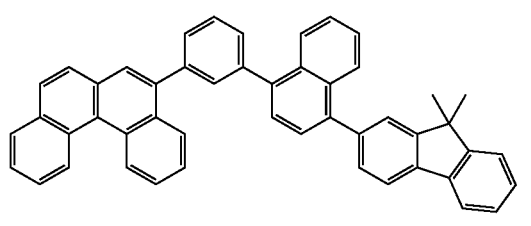
61
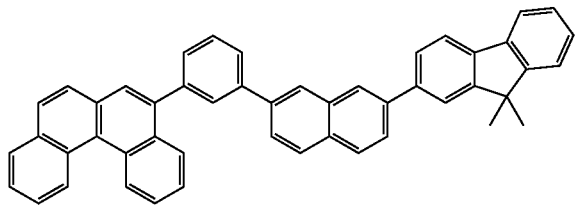
62
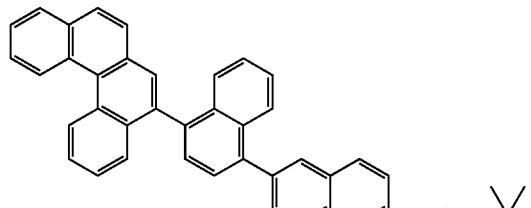
63
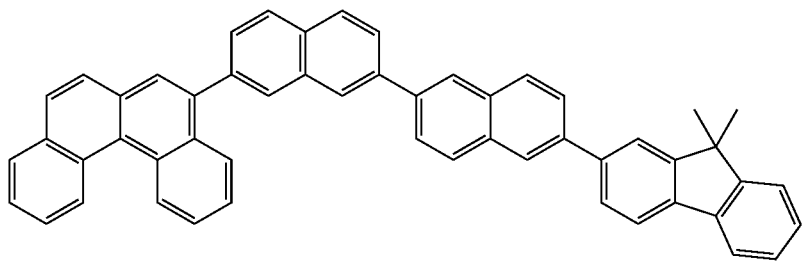
64
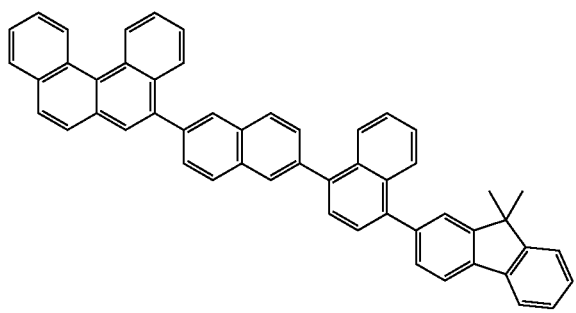
65
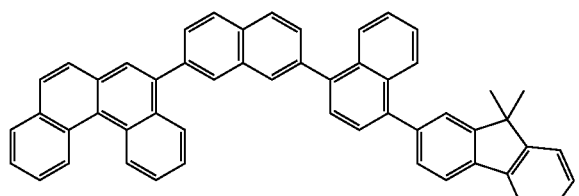

66
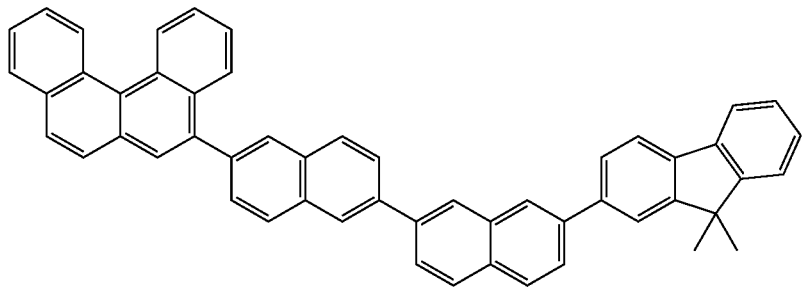
67
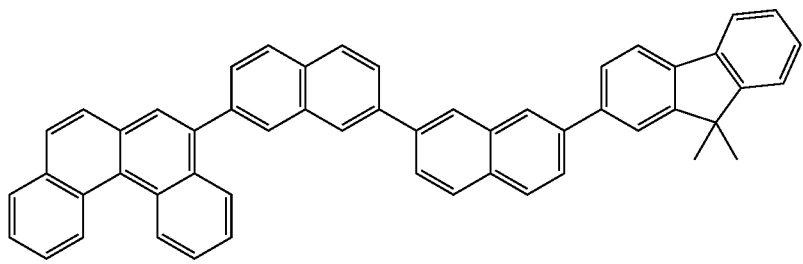
68
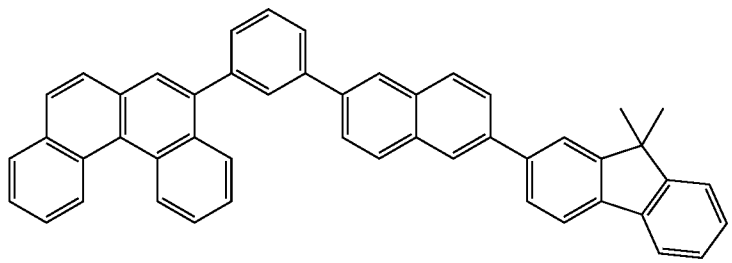
69
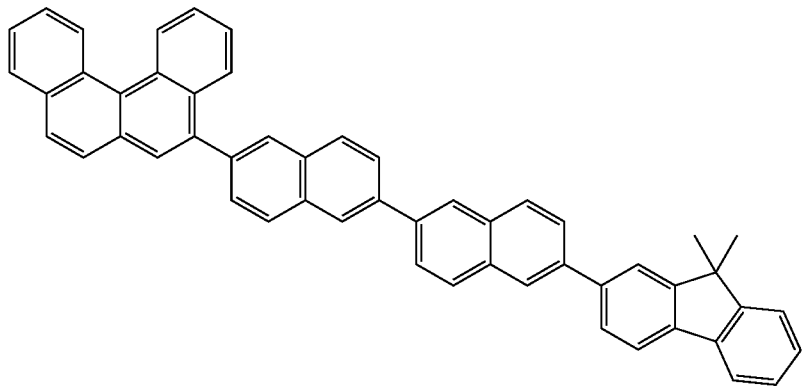
70 71
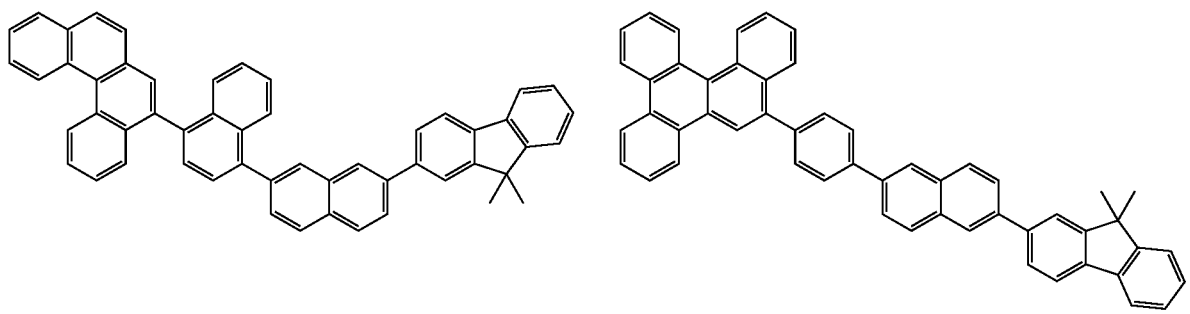

-continued
72
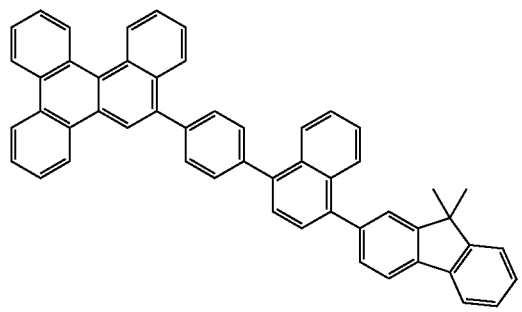
73
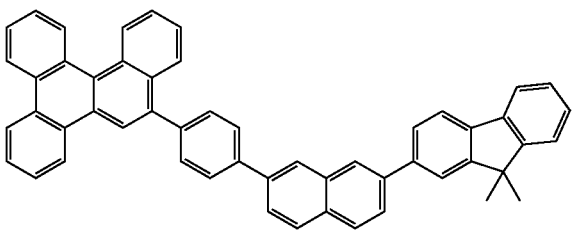
74
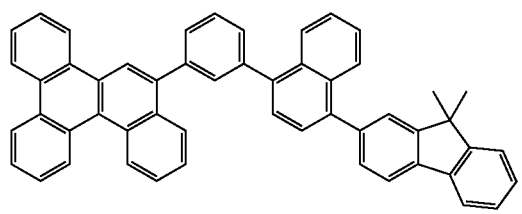
75
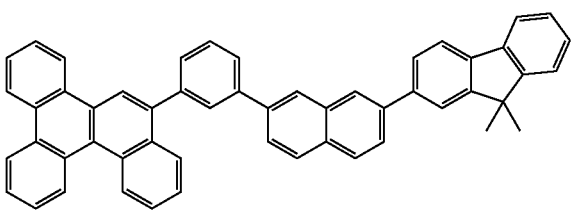
76
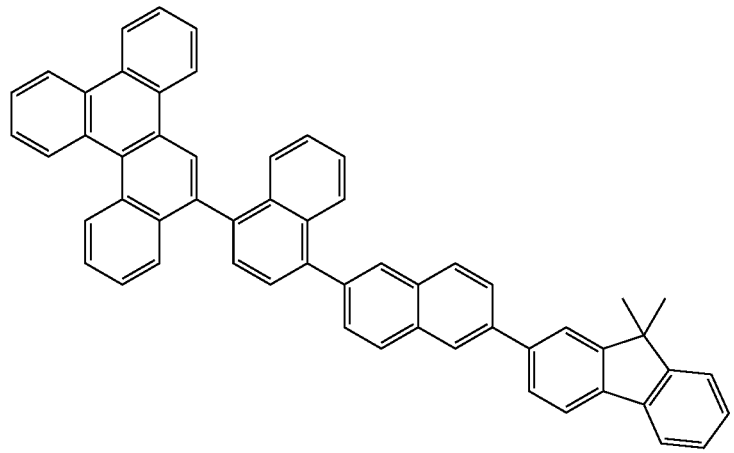
77
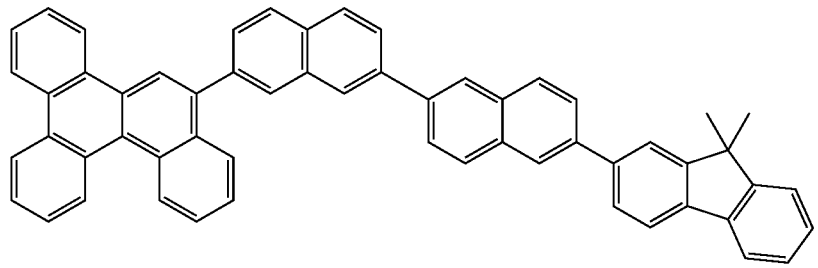
78
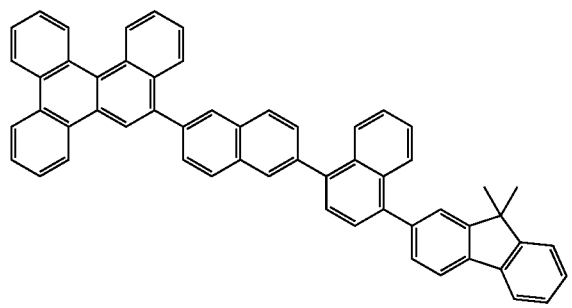
79
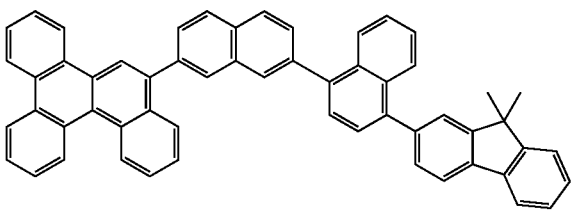

-continued
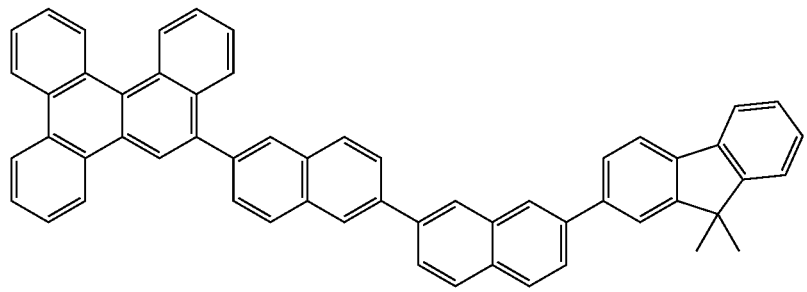
80
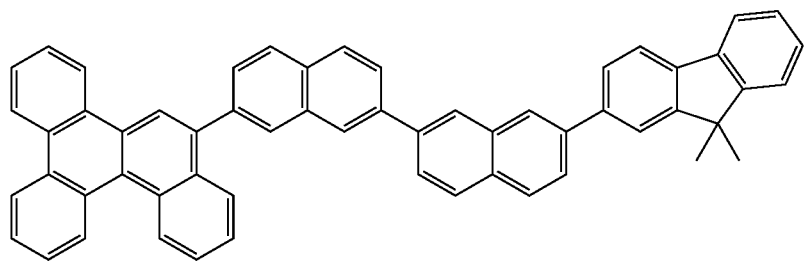
81
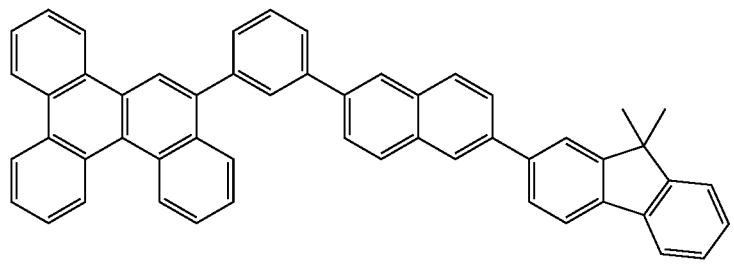
82
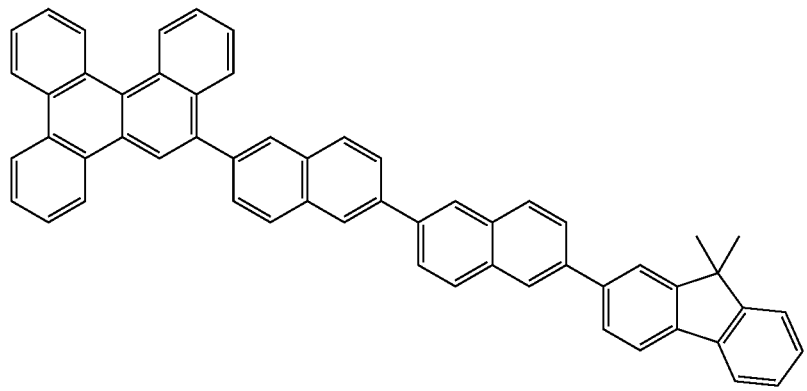
83
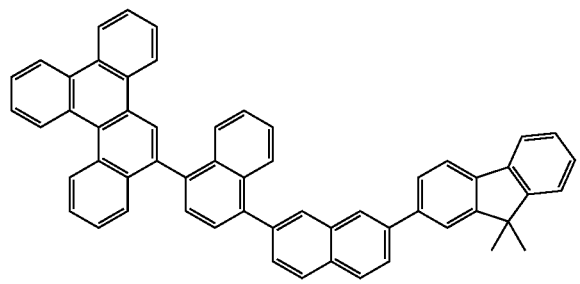
84
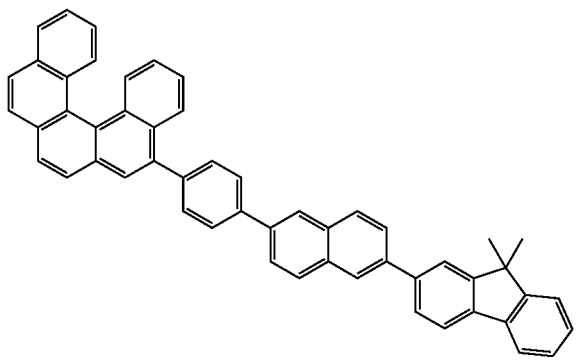
85

-continued
86
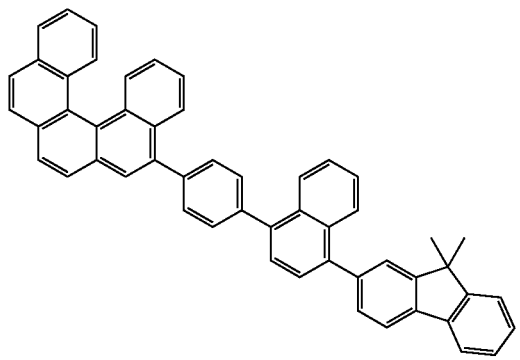
87
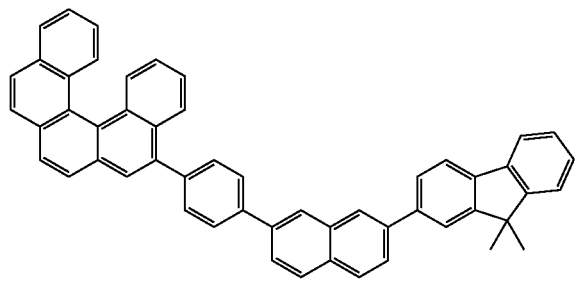
88
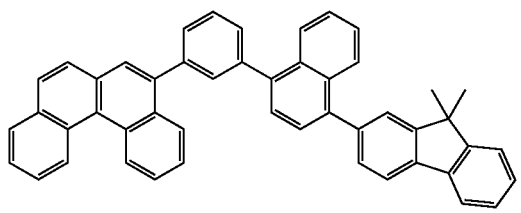
89
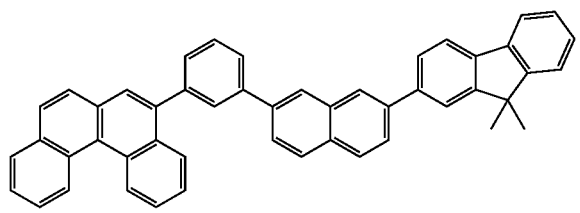
90
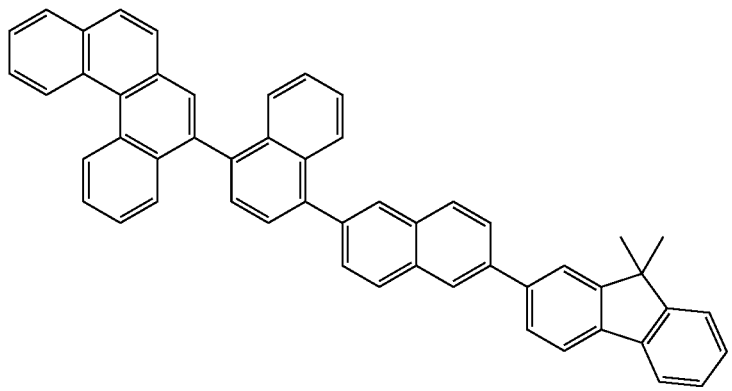
91
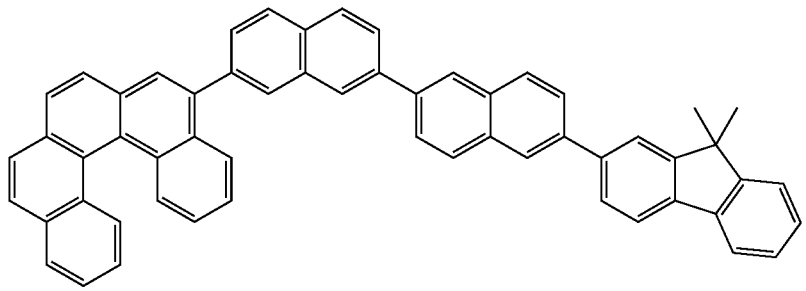

-continued
92
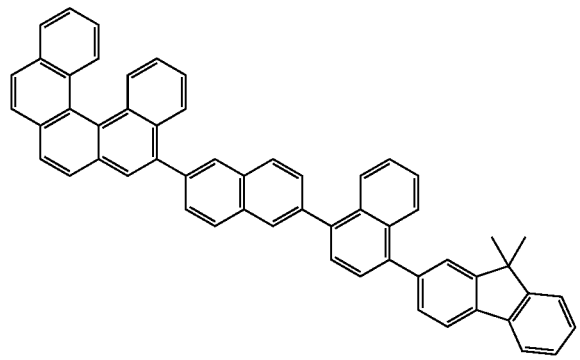
93
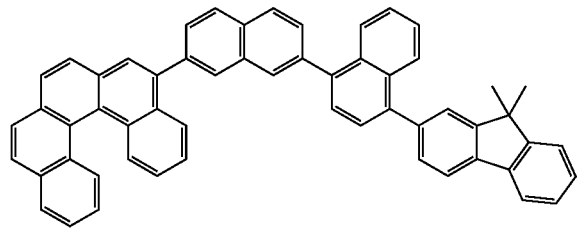
94
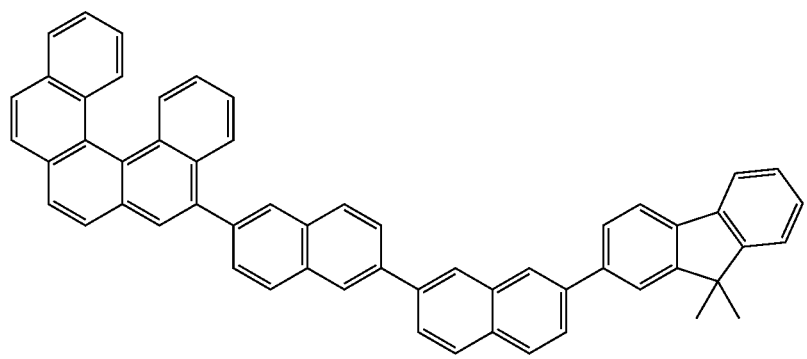
95
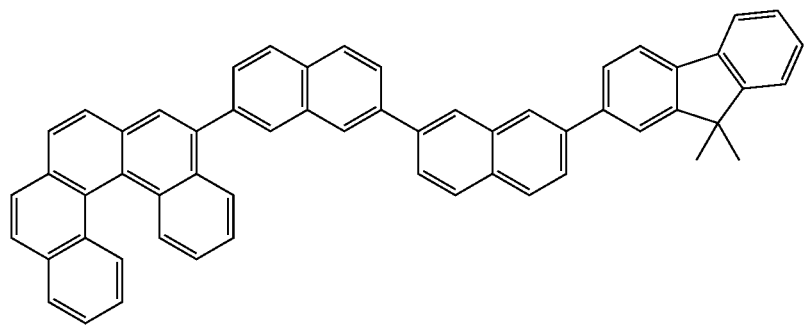
96
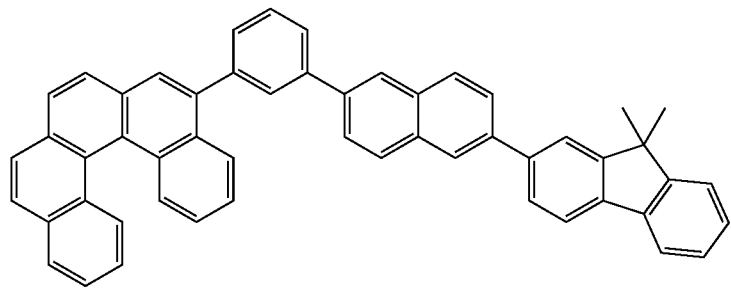

-continued
97
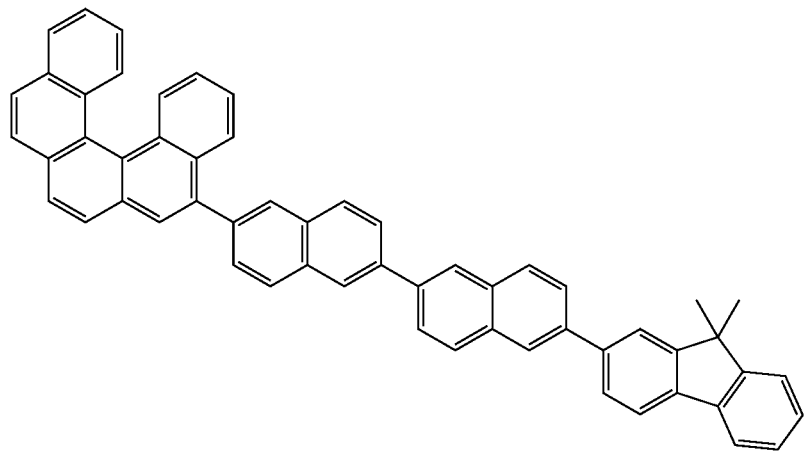
98 99
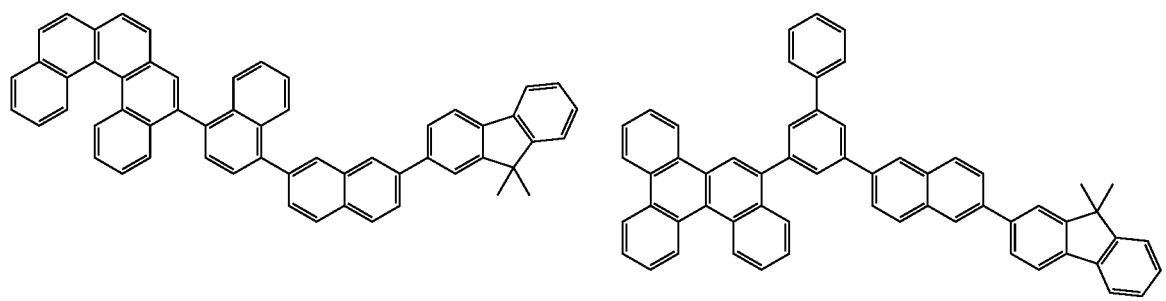
100 101
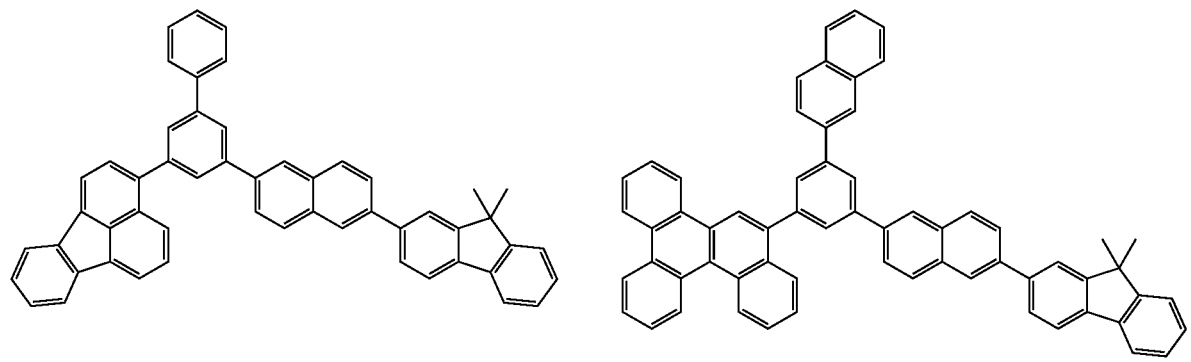
102 103
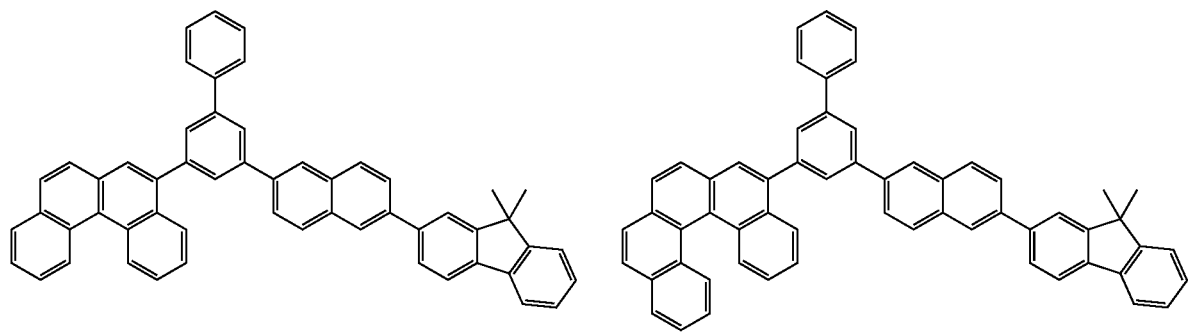

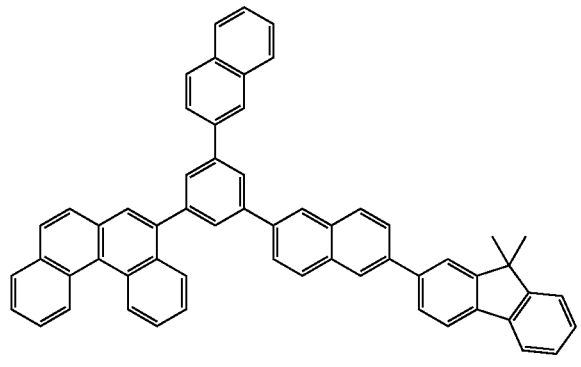

104

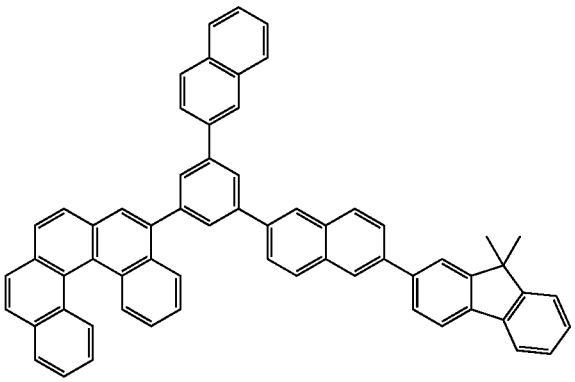

105

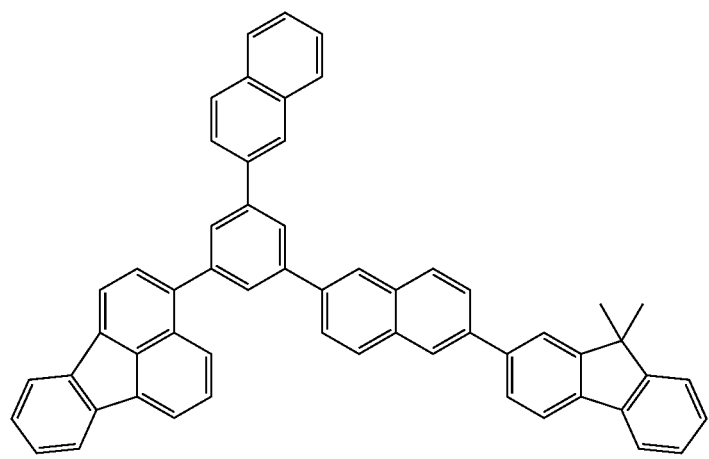

106

With regard to phosphorescent emitter materials capable of use in the OLEDs of the present invention, Ir(2-phenylquinoline) and Ir(1-phenylisoquinoline) type phosphorescent materials have been synthesized, and OLEDs incorporating them as the dopant emitters have been fabricated. Such devices may advantageously exhibit high current efficiency, high stability, narrow emission, high processibility (such as high solubility and low evaporation temperature), high luminous efficiency, and/or high luminous efficiency.

Using the base structure of Ir(3-Meppy)$_3$, different alkyl and fluoro substitution patterns have been studied to establish a structure-property relationship with respect to material processibility (evaporation temperature, evaporation stability, solubility, etc.) and device characteristics of Ir(2-phenylquinoline) and Ir(1-phenylisoquinoline) type phosphorescent materials. Alkyl and fluoro substitutions are particularly important because they offer a wide range of tenability in terms of evaporation temperature, solubility, energy levels, device efficiency, etc. Moreover, they are stable as functional groups chemically and in device operation when applied appropriately.

In one embodiment of the present invention, the phosphorescent emitter material comprises a phosphorescent organometallic complex having a substituted chemical structure represented by one of the following partial chemical structures represented by the following Formulas (B-1), (B-2) and (B-3):

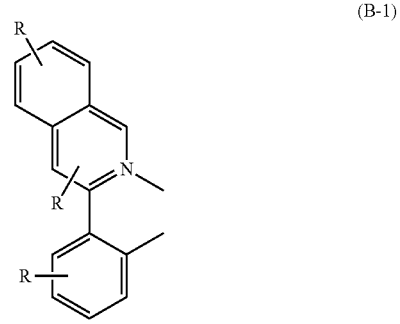

(B-1)

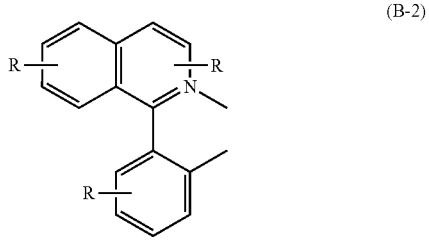

(B-2)

-continued (B-3)
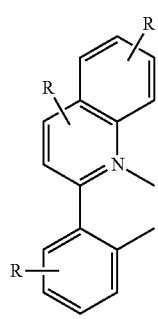

wherein R is independently hydrogen or an alkyl substituent having 1-3 carbon atoms, and wherein at least one ring of the formula has one or more of said alkyl substituent. In particular, the "substituted" structures include at least one methyl substituents, which may be substituted on any one of the rings. The phosphorescent organometallic complex according to the above structure may be substituted with any suitable number of methyl groups. Preferably the phosphorescent organometallic complex according to the above structure is substituted with at least two methyl groups.

Preferably the phosphorescent organometallic complex according to the above structure is substituted with at least two methyl groups. In a most preferred embodiment, the phosphorescent emitter material comprises a phosphorescent organometallic complex having a substituted chemical structure represented by the following partial chemical structure (3):

(3)
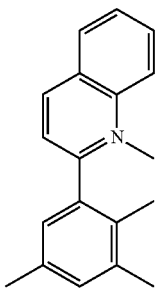

In another embodiment, the phosphorescent emitter material comprises a metal complex, and the metal complex comprises a metal atom selected from Ir, Pt, Os, Au, Cu, Re and Ru and a ligand. In yet another embodiment the metal complex has an ortho-metal bond. The metal atom is preferably Ir.

In another embodiment, the phosphorescent emitter material comprises a phosphorescent organometallic compound having a substituted chemical structure represented by the following chemical structure (4):

(4)
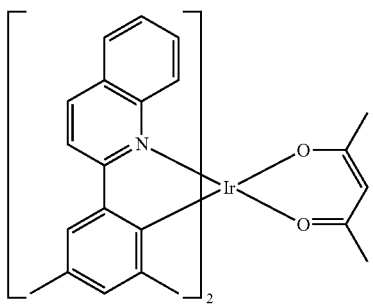

In a preferred embodiment, the present invention relates to an OLED wherein the host material comprises an unsubstituted aromatic hydrocarbon compound having the chemical structure represented by the formula (A-1-42):

(A-1-42)
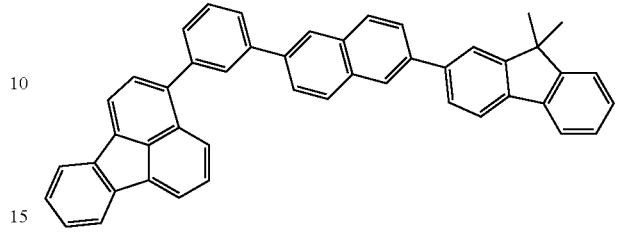

and wherein the phosphorescent emitter material comprises a phosphorescent organometallic compound having a substituted chemical structure represented by the following chemical structure (4):

(4)
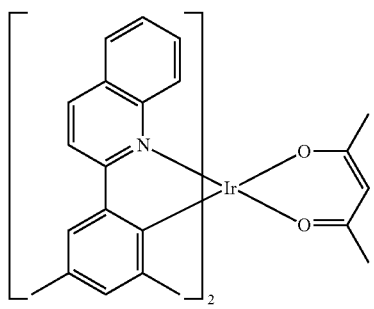

In another preferred embodiment, the present invention relates to an OLED wherein the host material comprises an unsubstituted aromatic hydrocarbon compound having the chemical structure represented by the formula (A-1-42):

(A-1-42)
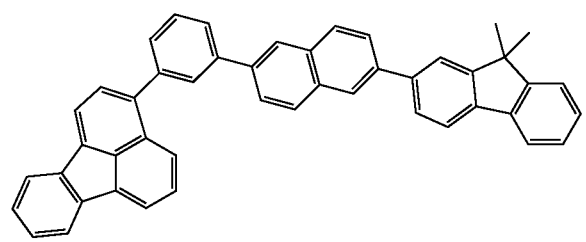 [SMILES: CC1(C)c2ccccc2-c2ccc(-c3ccc4cc(-c5cccc(-c6ccc7c8c(cccc68)-c6ccccc6-7)c5)ccc4c3)cc21]

and wherein the phosphorescent emitter material comprises a phosphorescent organometallic compound having a substituted chemical structure represented by the following chemical structure (5):

(5)
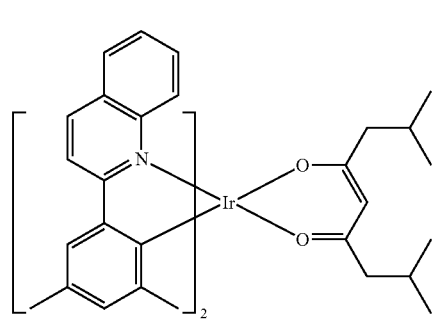

The OLEDs of the present invention may comprise a hole transporting layer (hole injecting layer), and the above hole transporting layer (hole injecting layer) preferably contains the materials of the present invention. Also, the OLEDs of the present invention may comprise an electron transporting layer and/or a hole blocking layer, and the above electron transporting layer and/or hole blocking layer preferably contains the materials of the present invention.

The OLEDs of the present invention may contain a reductant dopant in an interlayer region between the cathode and the organic thin film layer. Such an OLED having the described structural constitution, may exhibit improved emission luminance and extended lifetime.

The reductant dopant includes at least one dopant selected from alkali metals, alkali metal complexes, alkali metal compounds, alkali earth metals, alkali earth metal complexes, alkali earth metal compounds, rare earth metals, rare earth metal complexes, rare earth metal compounds and the like.

Suitable alkali metals include Na (work function: 2.36 eV), K (work function: 2.28 eV), Rb (work function: 2.16 eV), Cs (work function: 1.95 eV) and the like, and the compounds having a work function of 2.9 eV or less are particularly preferred. Among them, K, Rb and Cs are preferred, more preferred are Rb or Cs, and even more preferred is Cs.

The alkali earth metals include Ca (work function: 2.9 eV), Sr (work function: 2.0 to 2.5 eV), Ba (work function: 2.52 eV) and the like, and the compounds having a work function of 2.9 eV or less are particularly preferred.

The rare earth metals include Sc, Y, Ce, Tb, Yb and the like, and the compounds having a work function of 2.9 eV or less are particularly preferred.

Among the metals described above, it is preferred to select metals having a high reducing ability, and addition of a relatively small amount thereof to the electron injecting region may make it possible to enhance the emission luminance and extend the lifetime of the OLED.

The alkali metal compounds include alkali metal oxides such as $Li_2O$, $Cs_2O$, $K_2O$ and the like and alkali metal halides such as LiF, NaF, CsF, KF and the like. Preferred compounds include LiF, $Li_2O$ and NaF.

The alkali earth metal compounds include BaO, SrO, CaO and $Ba_xSr_{1-x}O$ (0<x<1), $Ba_xCa_{1-x}O$ (0<x<1) and the like which are obtained by mixing the above compounds, and BaO, SrO and CaO are preferred.

The rare earth metals compound include $YbF_3$, $ScF_3$, $ScO_3$, $Y_2O_3$, $Ce_2O_3$, $GdF_3$, $TbF_3$ and the like, and $YbF_3$, $ScF_3$ and $TbF_3$ are preferred.

The alkali metal complex, the alkali earth metal complex and the rare earth metal complex shall not specifically be restricted as long as they contain at least one metal ion of alkali metal ions, alkali earth metal ions and rare earth metal ions. The ligand is preferably quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfulvorane, bipyridyl, phenanthroline, phthalocyanine, porphyrin, cyclopentadiene, β-diketones, azomethines and derivatives thereof. However, suitable materials are not restricted to the above-mentioned compounds.

The reductant dopant may be formed in an interfacial region, and is preferably in a layer form or an island form. The forming method may be a method in which a light emitting material forming an interfacial region and an organic substance corresponding to an electron injecting material are deposited at the same time while depositing the reductant dopant by a resistance heating vapor deposition method to thereby disperse the reductant dopant in the organic substance. The dispersion concentration has a ratio of organic substance to reductant dopant of from about 100:1 to 1:100, and preferably from about 5:1 to 1:5 in terms of the mole ratio.

When the reductant dopant is formed in a layer form, the light emitting material which is an organic layer in an interfacial region and the electron injecting material are formed in a layer form, and then the reductant dopant may be deposited alone by the resistance heating vapor deposition method to form the layer preferably in a thickness of 0.1 to 15 nm.

When the reductant dopant is formed in an island form, the light emitting material which is an organic layer in an interfacial region and the electron injecting material are formed in an island form, and then the reductant dopant may be deposited alone by the resistance heating vapor deposition light emitting method to form the island preferably in a thickness of 0.05 to 1 nm.

A mole ratio of the main component to the reductant dopant in the OLEDs of the present invention is preferably main component:reductant dopant=5:1 to 1:5, more preferably 2:1 to 1:2 in terms of a mole ratio.

The OLEDs of the present invention preferably have an electron injecting layer between the light emitting layer and the cathode. In this regard, the electron injecting layer may be a layer which functions as an electron transporting layer. The electron injecting layer or the electron transporting layer is a layer for assisting injection of an electron into the light emitting layer, and it has a large electron mobility. The electron injecting layer is provided to control an energy level including relaxation of a sudden change in the energy level.

The forming methods of the respective layers in the OLEDs of the present invention shall not specifically be restricted, and forming methods carried out by a vacuum vapor deposition method, a spin coating method and the like which have so far publicly been known can be used. The organic thin film layer containing the host material compounds represented by Formula (A-1) described above which is used for the OLEDs of the present invention can be formed by known methods such as by vacuum vapor deposition, molecular beam evaporation (MBE method), and coating methods such as dipping, spin coating, casting, bar coating and roll coating, each using a solution prepared by dissolving the compound in a solvent.

The film thicknesses of the respective organic layers in the OLEDs of the present invention shall not specifically be restricted. In general, too small film thicknesses may be associated with defects such as pinholes and the like, while too large film thicknesses require application of high voltage, and may lower the efficiency. Accordingly, film thicknesses are typically in the a range of one to several nm to 1 μm.

The compound groups of the present invention can be synthesized by using a Suzuki-Miyaura cross coupling reaction and the like. They can be synthesized, for example, in a manner shown in the following reaction formulas. Formulas (1) to (4) are abbreviated as follows,

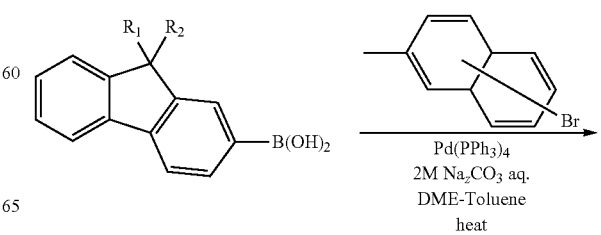

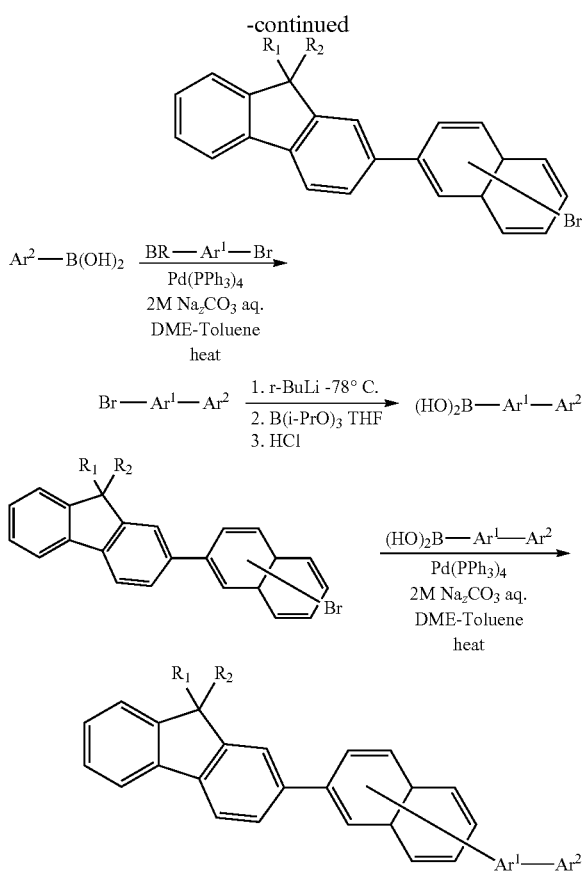

INDUSTRIAL APPLICABILITY

The present invention can be used as a phosphorescent OLED having high efficiency and a long lifetime, and materials for an OLED which provide a phosphorescent OLED having high efficiency and a long lifetime.

The following examples are illustrative only and are not intended to be limiting. Those skilled in the art will recognize, or be able to ascertain through routine experimentation, numerous equivalents to the specific substances and procedures described herein. Such equivalents are considered to be within the scope of the claimed invention. All references named herein are expressly and entirely incorporated by reference.

EXAMPLES

Example 1

Synthetic Example

Synthesis of Compound 42

1) Synthesis of 2-(6-bromonaphthalene-2-yl)-9,9-dimethyl-9H-fluorene 16.65 g (69.9 mmol) of 9,9-dimethyl-9H-fluorene-2-ylboronic acid, 20.0 g (69.9 mmol) of 2,6-dibromonaphthalene, 4.04 g (3.50 mmol) of tetrakis(triphenylphosphine)palladium (0), 200 ml of toluene, 200 ml of dimethoxyethane and 106 g of a 2M sodium carbonate aqueous solution were combined under argon atmosphere, and the mixture was stirred at 85° C. for 8 hours and left standing overnight. Water was added to the reaction mixture, and the mixture was stirred at room temperature for one hour. The mixture was filtered, the filtrate was extracted with toluene, and the organic phase was washed with water and subsequently with a saturated saline solution. The liquid was dried on sodium sulfate, and then toluene was removed by distillation under reduced pressure. A brown oily substance which resulted was refined by silica gel chromatography to obtain 11.8 g (yield: 42.4%) of 2-(6-bromonaphthalene-2-yl)-9,9-dimethyl-9H-fluorene.

2) Synthesis of 6-(9,9-dimethyl-9H-fluorene-2-yl)naphthalen-2-ylboronic acid

A mixed solution of 12.00 g (30.1 mmol) of 2-(6-bromonaphthalene-2-yl)-9,9-dimethyl-9H-fluorene and 120 ml of dehydrated THF was cooled to −70° C. under argon atmosphere, and 23.3 ml (36.0 mmol) of a hexane solution of 1.55M n-butyllithium was added dropwise thereto with stirring. The reaction mixture was stirred at −70° C. for 2 hours. The reaction solution was cooled again to −70° C., and 17.0 g (90.2 mol) of triisopropyl borate was added dropwise thereto. The reaction mixture was heated to room temperature and stirred for one hour, then it was left standing overnight. The reaction mixture was cooled on an ice bath, and a 6N hydrochloric acid aqueous solution was added thereto and stirred at room temperature for one hour. Dichloromethane was added to the reaction mixture to separate the liquid, and the organic phase was washed with water and dried on sodium sulfate. The solvent was removed by distillation under reduced pressure, and the residue was refined by silica gel chromatography to obtain 6.25 g (yield: 57%) of 6-(9,9-dimethyl-9H-fluorene-2-yl)naphthalene-2-ylboronic acid.

3) Synthesis of 3-(3-bromophenyl)fluoranthene 18.18 g (81.3 mmol) of 3-fluorantheneboronic acid, 22.99 g (81.3 mmol) of 3-bromoiodobenzene, 4.70 g (4.10 mmol) of tetrakis(triphenylphosphine)palladium (0), 80 ml of toluene, 80 ml of dimethoxyethane and 123 g of a 2M sodium carbonate aqueous solution were combined under argon atmosphere, and the mixture was stirred for 8 hours with refluxing and heating. After finishing the reaction, water was added to the reaction mixture, and the mixture was stirred at room temperature for one hour. Methanol was added thereto, and a solid matter was obtained by filtering, and it was refined by silica gel chromatography to obtain 20.43 g (yield: 70.4%) of 3-(3-bromophenyl)fluoranthene.

4) Synthesis of compound 42

The compound was synthesized in the same manner by using 6-(9,9-dimethyl-9H-fluorene-2-yl)naphthalene-2-ylboronic acid in place of 3-fluorantheneboronic acid and using 3-(3-bromophenyl)fluoranthene in place of 3-bromoiodobenzene in the synthesis of 3-(3-bromophenyl)fluoranthene.

Mass spectrum analysis was carried out to result in finding that m/e was 596 versus a molecular weight of 596.25.

The characteristics of the combinations in the present invention are that a triplet energy gap of the host materials and a triplet energy gap of the dopants are suitable, and therefore the emission coefficients are enhanced; the specific condensed polycyclic hydrocarbon residue is bonded to the fluorene ring residue, whereby the device is reduced more in voltage; since the host material is not substituted with a nitrogen-containing ring, a nitrogen atom and the like, the light emitting material has a high durability against holes and electrons, and this allows the lifetime to be extended more than those of combinations known in the art.

Example 2

Table 1 provides data using exemplary compounds as well as devices using the host materials and phosphorescent emitter materials of the invention.

TABLE 1

| Device # | Anode | HIL | Host | emitter % | ETL | Cathode | At 10 mA·cm^2 CIE x | CIE y | V | Cd/A | EQE | lm/W | LT80 (hrs) at 40 mA/cm^2 70° C. | 25° C. |
|---|---|---|---|---|---|---|---|---|---|---|---|---|---|---|
| Reference 1 | ITO [120 nm] | HIL [10 nm] | PHU-02 [30 nm] | RD002 9% | Alq3 [55 nm] | LiF[1 nm]/ Al[100 nm] | 0.668 | 0.330 | 7.7 | 20.5 | 19.2 | 8.3 | 215 | 1,396 |
| Reference 2 | ITO [120 nm] | HIL [10 nm] | PHU-02 [30 nm] | RD002 12% | Alq3 [55 nm] | LiF[1 nm]/ Al[100 nm] | 0.669 | 0.329 | 7.9 | 19.6 | 18.8 | 7.8 | 205 | 1,387 |
| 1 | ITO [120 nm] | HIL [10 nm] | PHU-18 [30 nm] | RD002 9% | Alq3 [55 nm] | LiF[1 nm]/ Al[100 nm] | 0.672 | 0.326 | 7.0 | 17.3 | 17.4 | 7.7 | 255 | 3,200 |
| 2 | ITO [120 nm] | HIL [10 nm] | PHU-18 [30 nm] | RD002 12% | Alq3 [55 nm] | LiF[1 nm]/ Al[100 nm] | 0.671 | 0.327 | 6.9 | 17.5 | 17.7 | 7.9 | 238 | 2,800 |
| 3 | ITO [120 nm] | HIL [10 nm] | PHU-18 [30 nm] | RD002 9% | Alq3 [55 nm] | LiF[1 nm]/ Al[100 nm] | 0.668 | 0.330 | 6.7 | 17.3 | 16.0 | 8.1 | 350 | 1,600 |
| 4 | ITO [120 nm] | HIL [10 nm] | PHU-18 [30 nm] | RD002 12% | Alq3 [55 nm] | LiF[1 nm]/ Al[100 nm] | 0.670 | 0.329 | 6.6 | 17.0 | 16.2 | 8.1 | 306 | 1,500 |

All devices shown in Table 1 were fabricated by high vacuum (<10-7 Torr) thermal evaporation. The anode electrode consisted of ~120 nm of indium tin oxide (ITO). The cathode consisted of 1 nm of LiF followed by 100 nm of Al. All devices were encapsulated with a glass lid sealed with an epoxy resin in a nitrogen glove box (<1 ppm of H2O and O2) immediately after fabrication, and a moisture getter was incorporated inside the package. Operational lifetests were performed at constant direct current at room temperature.

For Invention Devices 1-4 and the Reference Device, the organic stack was fabricated to consist of, sequentially from the ITO surface, HIL-1 as a hole injection layer; NPD as a hole transport layer; 30 nm of the invention host compound PHU-18 or comparative host compound PHU-02 doped with 9 or 12 wt % of the dopant emitters RD-002 or RD-003 as the emissive layer (EML). Adjacent to the emissive layer was an electron transport layer consisting of tris(8-hydroxyquinolinato)aluminum (Alq3). Specific layer materials and layer thicknesses for each device are shown in Table 1. Structures for PHU-02, RD-002, HIL-1 and other device materials are shown in Table 2, below.

The devices were operated at a constant current of 40 mA/cm$^2$ at 25° C. and at 70° C., and the time for the luminance to decrease to 80% of its initial level (LT80) was measured. As shown in Table 1, the host material PHU-18 and the phosphorescent emitter materials RD-002 and RD-003 of the invention demonstrated efficiency and lifetime that was significantly better than the reference example. In particular, the results for the lifetimes of the devices at 70° C. show that devices which incorporated the host materials and phosphorescent emitter materials of the invention had at least a 25% improvement compared to the reference example for host material PHU-18 doped with emitter material RD-002 (devices 1 and 2), and at least about 50% improvement compared to the reference example for host material PHU-18 doped with emitter material RD-003 (devices 3 and 4).

Device 1 had the longest LT80 at 25° C. and 70° C., and device 4 was the most highest power efficacy with the long LT80 at 25° C. and 70° C. Device 4 had higher power efficacy because it operated at lower voltage and higher luminous efficiency than devices 1 and 2.

TABLE 2

HIL-1

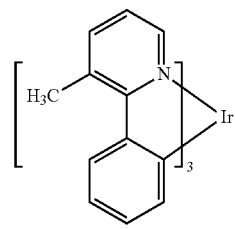

RD-002

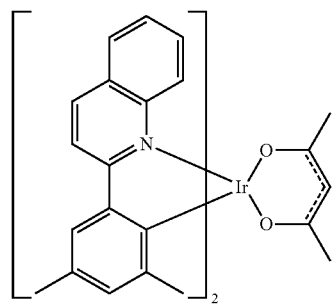

TABLE 2-continued
| | |
|---|---|
| RD-003 | 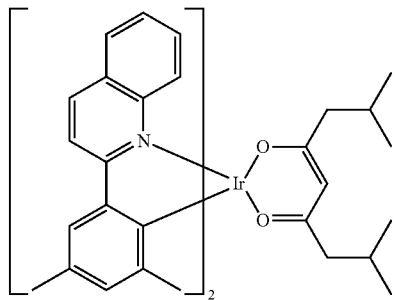 |
| PHU-18<br>Host | 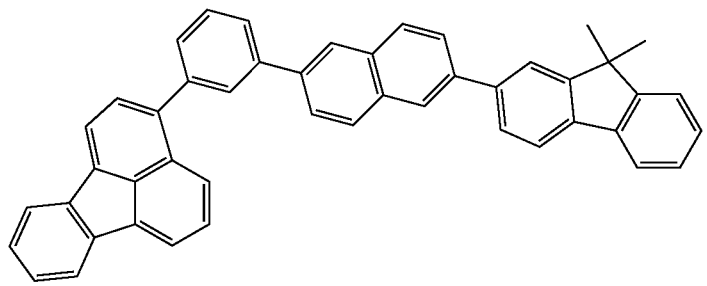 [SMILES: CC1(C)c2ccccc2-c2ccc(-c3ccc4cc(-c5cccc(-c6ccc7c8c(cccc68)-c6ccccc6-7)c5)ccc4c3)cc21] |
| PHU-02<br>Host | 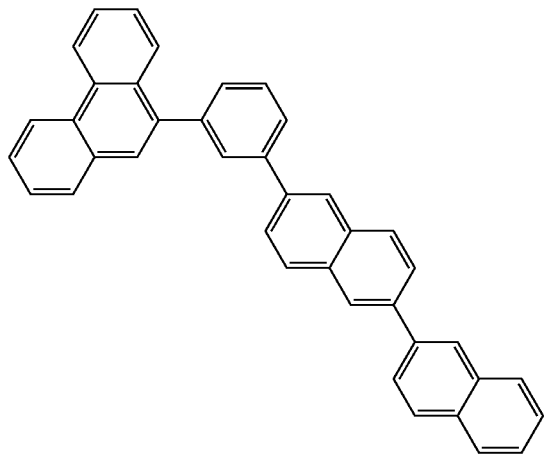 [SMILES: c1cc(-c2ccc3cc(-c4ccc5ccccc5c4)ccc3c2)cc(-c2cc3ccccc3c3ccccc23)c1] |
| NPD<br>N,N'-Bis(naphthalen-1-yl)-N,N'-bis(phenyl)benzidine | 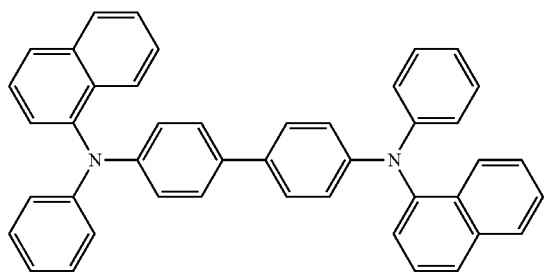 [SMILES: c1ccc(N(c2ccc(-c3ccc(N(c4ccccc4)c4cccc5ccccc45)cc3)cc2)c2cccc3ccccc23)cc1] |
| Alq₃<br>Tris(8 hydroxyquinoline) aluminum | 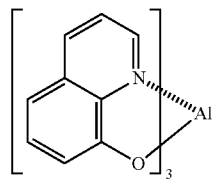 |

TABLE 2-continued

BAlq₂
Aluminum(III)bis(2-methyl-8-quinolato)4-phenylphenolate

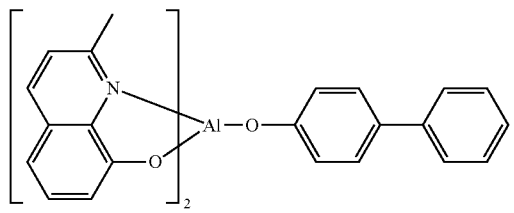

CBP
4,4'-Bis(carbazol-9-yl)biphenyl

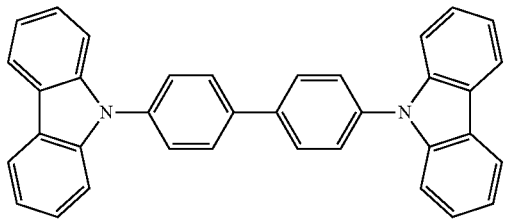 [SMILES: c1ccc2c(c1)c1ccccc1n2-c1ccc(-c2ccc(-n3c4ccccc4c4ccccc43)cc2)cc1]

ITO     Indium Tin Oxide

BAlq₂
Aluminum(III)bis(2-methyl-8-quinolato)4-phenylphenolate

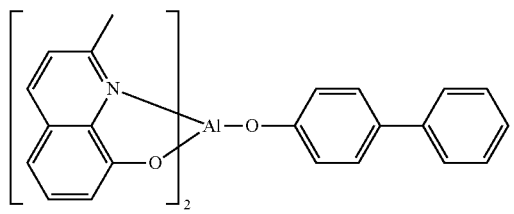

What is claimed is:

1. An organic light emitting device comprising an anode, a cathode and an emissive layer, wherein the emissive layer is located between the anode and the cathode, and the emissive layer comprises a host material and a phosphorescent emitter material, wherein:

(a) the host material comprises a substituted or unsubstituted hydrocarbon compound having the chemical structure represented by the formula (A-1):

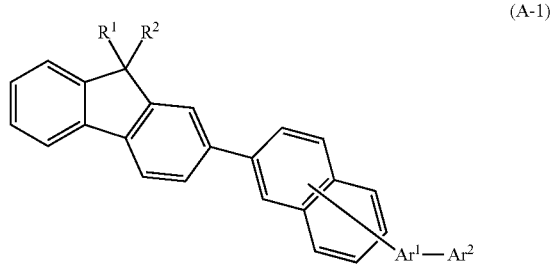

(A-1)

wherein $R^1$ and $R^2$ each represent independently a substituted or unsubstituted alkyl group having from 1 to about 5 carbon atoms; $Ar^1$ represents a divalent residue of a benzene ring, a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or a picene ring; and $Ar^2$ represents a monovalent residue of a naphthalene ring, a chrysene ring, a phenanthrene ring, a benzophenanthrene ring, a dibenzophenanthrene ring, a benzo[a]triphenylene ring, a benzochrysene ring, a fluoranthene ring, a benzo[b]fluoranthene ring or a picene ring; and $Ar^1$ and $Ar^2$ each may have independently one or plural substituent(s) selected from the group consisting of an alkyl group having 1 to about 3 carbon atoms, a cycloalkyl group having about 5 to about 7 ring-forming carbon atoms, a silyl group having about 3 to about 12 carbon atoms, a cyano group, a halogen atom and an aryl group having about 6 to about 16 ring-forming carbon atoms; and (b) the phosphorescent emitter material comprises a phosphorescent organometallic complex having a substituted chemical structure represented by one of the following partial chemical structures represented by the formulas:

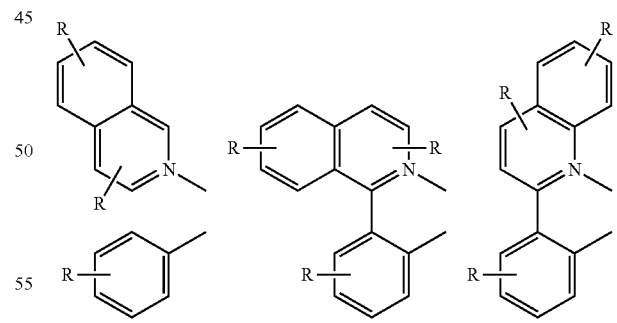

wherein R is independently hydrogen or an alkyl substituent having 1-3 carbon atoms, and wherein at least one ring of the formula has one or more of said alkyl substituent.

2. The organic light emitting device of claim 1, wherein, in the host material, $Ar^1$ is a divalent residue of a benzene ring, and, $Ar^2$ is a monovalent residue of a Fluoranthene ring, and the host material has the chemical structure represented by the formula:

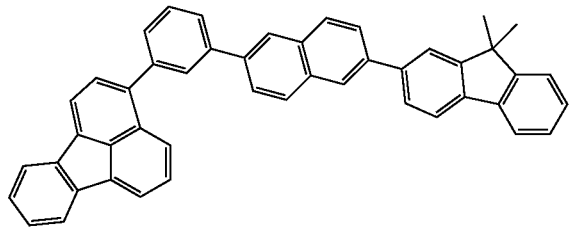 [SMILES: CC1(C)c2ccccc2-c2ccc(-c3ccc4cc(-c5cccc(-c6ccc7c8c(cccc68)-c6ccccc6-7)c5)ccc4c3)cc21]

3. The organic light emitting device of claim 1, wherein the triplet energy of the host material is from about 2.0 eV to about 2.8 eV.

4. The organic light emitting device of claim 1, wherein the phosphorescent emitter material comprises a phosphorescent organometallic complex wherein the substituted chemical structure is substituted with at least two methyl groups.

5. The organic light emitting device of claim 1, wherein the phosphorescent emitter material comprises a phosphorescent organometallic complex having a substituted chemical structure represented by the following partial chemical structure:

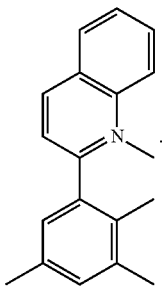

6. The organic light emitting device of claim 1, wherein the phosphorescent emitter material comprises a metal complex, and the metal complex comprises a metal atom selected from Ir, Pt, Os, Au, Cu, Re, Ru and a ligand.

7. The organic light emitting device of claim 6, wherein the metal complex has an ortho-metal bond.

8. The organic light emitting device of claim 7, wherein the metal atom is Ir.

9. The organic light emitting device of claim 1, wherein the phosphorescent emitter material comprises a phosphorescent organometallic compound having a substituted chemical structure represented by the following chemical structure:

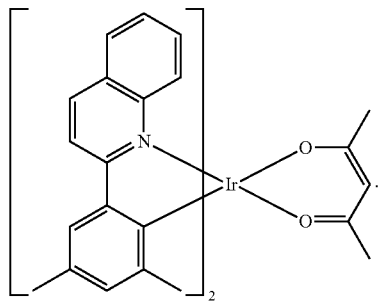

10. The organic light emitting device of claim 1, wherein the phosphorescent emitter material comprises a phosphorescent organometallic compound having a substituted chemical structure represented by the following chemical structure:

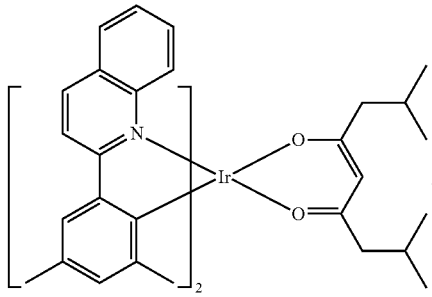

11. The organic light emitting device of claim 1, wherein the host material comprises an unsubstituted aromatic hydrocarbon compound having the chemical structure represented by the formula:

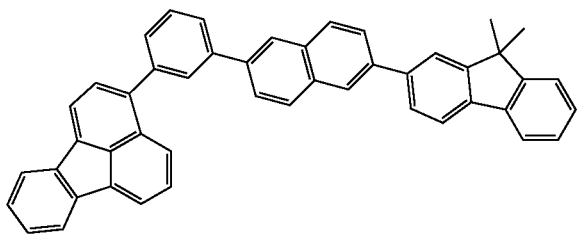 [SMILES: CC1(C)c2ccccc2-c2ccc(-c3ccc4cc(-c5cccc(-c6ccc7c8c(cccc68)-c6ccccc6-7)c5)ccc4c3)cc21]

and wherein the phosphorescent emitter material comprises a phosphorescent organometallic compound having a substituted chemical structure represented by the following chemical structure:

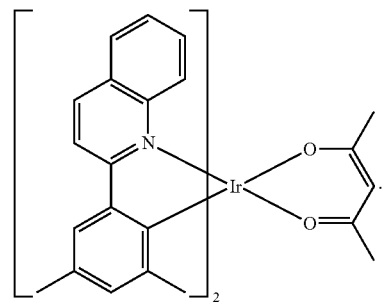

12. The organic light emitting device of claim 11, wherein at least one of the phosphorescent materials contained in the light emitting layer has a maximum value of 520 nm or more and 720 nm or less in a light emitting wavelength.

13. The organic light emitting device of claim 1, wherein the host material comprises an unsubstituted aromatic hydrocarbon compound having the chemical structure represented by the formula:

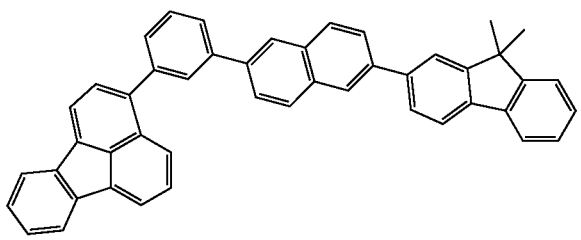 [SMILES: CC1(C)c2ccccc2-c2ccc(-c3ccc4cc(-c5cccc(-c6ccc7c8c(cccc68)-c6ccccc6-7)c5)ccc4c3)cc21]

and wherein the phosphorescent emitter material comprises a phosphorescent organometallic compound having a substituted chemical structure represented by the following chemical structure:
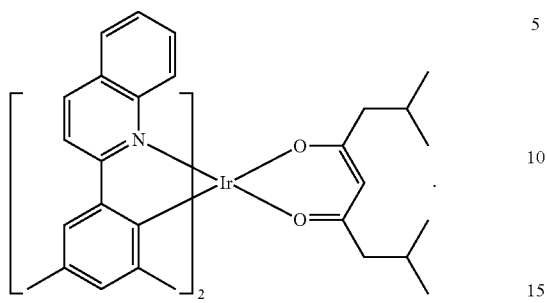
14. The organic light emitting device of claim 13, wherein at least one of the phosphorescent materials contained in the light emitting layer has a maximum value of 520 nm or more and 720 nm or less in a light emitting wavelength.
* * * * *